US 11,723,189 B2

(12) United States Patent
Lee et al.

(10) Patent No.: US 11,723,189 B2
(45) Date of Patent: Aug. 8, 2023

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Eun Young Lee, Hwaseong-si (KR); Do Hyung Kim, Seongnam-si (KR); Taek Jung Kim, Seoul (KR); Seung Jong Park, Seoul (KR); Jae Wha Park, Yongin-si (KR); Youn Jae Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/372,880

(22) Filed: Jul. 12, 2021

(65) Prior Publication Data

US 2022/0173108 A1    Jun. 2, 2022

(30) Foreign Application Priority Data

Dec. 1, 2020  (KR) .................. 10-2020-0165802

(51) Int. Cl.
*H10B 12/00*   (2023.01)
*H01L 23/528*  (2006.01)
(Continued)

(52) U.S. Cl.
CPC ......... *H10B 12/315* (2023.02); *H01L 23/528* (2013.01); *H01L 23/53266* (2013.01);
(Continued)

(58) Field of Classification Search
CPC ............ H01L 27/10814; H01L 23/528; H01L 23/53266; H01L 27/10823;
(Continued)

(56) References Cited

U.S. PATENT DOCUMENTS 6,544,834 B1   4/2003   Sugawara et al.
6,617,248 B1   9/2003   Yang
(Continued)

FOREIGN PATENT DOCUMENTS

CN   102299077 B   4/2013
JP     5390654 B2   1/2014
(Continued)

OTHER PUBLICATIONS

Taiwanese Office action dated Jul. 29, 2022.

*Primary Examiner* — Patricia D Valenzuela
(74) *Attorney, Agent, or Firm* — Lee IP Law, P.C.

(57) ABSTRACT

A semiconductor device and a method of fabricating a semiconductor device, the device including a substrate including an element isolation film and an active region defined by the element isolation film; a word line crossing the active region in a first direction; and a bit line structure on the substrate and connected to the active region, the bit line structure extending in a second direction crossing the first direction, wherein the bit line structure includes a first cell interconnection film including an amorphous material or (Continued)

ruthenium, a second cell interconnection film on and extending along the first cell interconnection film and including ruthenium, and a cell capping film on and extending along the second cell interconnection film.

18 Claims, 23 Drawing Sheets

(51) Int. Cl.
*H01L 23/532* (2006.01)
*H10N 50/01* (2023.01)
*H10N 50/80* (2023.01)

(52) U.S. Cl.
CPC ............. *H10B 12/34* (2023.02); *H10N 50/01* (2023.02); *H10N 50/80* (2023.02)

(58) Field of Classification Search
CPC ......... H01L 27/10855; H01L 27/10894; H01L 27/10885; H01L 27/1085; H01L 27/10897; H10B 12/315; H10B 12/34; H10B 12/09; H10B 12/482; H10B 12/0335; H10B 12/30; H10B 12/50; H10B 12/03; H10N 50/80; H10N 50/01
See application file for complete search history.

(56) References Cited

U.S. PATENT DOCUMENTS

| | | | |
|---|---|---|---|
| 8,089,117 | B2 | 1/2012 | Shimizu |
| 8,786,022 | B2 | 7/2014 | Katakami et al. |
| 9,793,368 | B2 | 10/2017 | Son et al. |
| 10,186,516 | B2 | 1/2019 | Jin et al. |
| 10,388,532 | B2 | 8/2019 | Ramalingam et al. |
| 2002/0153573 | A1 | 10/2002 | Mogami |
| 2016/0087109 | A1 | 3/2016 | Yasuda |
| 2017/0110507 | A1* | 4/2017 | Suh .................. H01L 28/00 |
| 2020/0227561 | A1 | 7/2020 | Yamazaki |
| 2021/0217658 | A1* | 7/2021 | Kim .................. H01L 21/76843 |

FOREIGN PATENT DOCUMENTS

| | | |
|---|---|---|
| KR | 1998-0060728 A | 10/1998 |
| TW | 202011517 A | 3/2020 |

* cited by examiner

SEMICONDUCTOR DEVICE AND METHOD OF FABRICATING THE SAME

CROSS-REFERENCE TO RELATED APPLICATION

Korean Patent Application No. 10-2020-0165802 filed on Dec. 1, 2020 in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same.

2. Description of the Related Art

As semiconductor devices become increasingly highly integrated, individual circuit patterns are further being miniaturized in order to implement more semiconductor devices in the same area. That is, as the degree of integration of the semiconductor devices increases, design rules for components of the semiconductor devices are decreasing.

In highly scaled semiconductor devices, as a critical dimension (CD) of electrodes becomes smaller, new integration technology has been considered.

SUMMARY

The embodiments may be realized by providing a semiconductor device including a substrate including an element isolation film and an active region defined by the element isolation film; a word line crossing the active region in a first direction; and a bit line structure on the substrate and connected to the active region, the bit line structure extending in a second direction crossing the first direction, wherein the bit line structure includes a first cell interconnection film including an amorphous material or ruthenium, a second cell interconnection film on and extending along the first cell interconnection film and including ruthenium, and a cell capping film on and extending along the second cell interconnection film.

The embodiments may be realized by providing a semiconductor device including a substrate including a cell region and a peripheral region around the cell region; a bit line structure extending in a first direction on the cell region of substrate, the bit line structure including a first cell interconnection film, a second cell interconnection film in contact with the first cell interconnection film, and a cell capping film on the second cell interconnection film; and a peripheral gate structure including a first peripheral interconnection film on the substrate in the peripheral region, a second peripheral interconnection film in contact with the first peripheral interconnection film, and a peripheral capping film on the second peripheral interconnection film, wherein the first cell interconnection film and the first peripheral interconnection film each include an amorphous material or ruthenium, and the second cell interconnection film and the second peripheral interconnection film each include ruthenium.

The embodiments may be realized by providing a method of fabricating a semiconductor device, the method including forming a trench on an active region of a substrate including an element isolation film and the active region defined by the element isolation film; forming a bit line contact filling the trench in the trench; forming a first cell interconnection film at a first temperature on the bit line contact and the substrate such that the first cell interconnection film includes ruthenium nitride; forming a second cell interconnection film at a second temperature on the first cell interconnection film such that the second cell interconnection film includes ruthenium; performing an annealing process on the second cell interconnection film; and forming a cell capping film on the second cell interconnection film on which the annealing process has been performed, wherein the second temperature is higher than the first temperature.

The embodiments may be realized by providing a semiconductor device including a substrate including an element isolation film and an active region defined by the element isolation film; a bit line contact arranged in a first direction on the active region of the substrate; and a bit line structure crossing the active region in the first direction and electrically connected to the substrate by the bit line contact, wherein the bit line structure includes a first cell interconnection film on the bit line contact, the first cell interconnection film extending in the first direction and including ruthenium, a second cell interconnection film in contact with the first cell interconnection film, the second cell interconnection film extending along the first cell interconnection film and including ruthenium, a cell capping film on and extending along the second cell interconnection film, and a third cell interconnection film extending along the first cell interconnection film between the substrate and the first cell interconnection film, the third cell interconnection film including a doped semiconductor material, wherein an upper surface of the third cell interconnection film is on substantially the same plane as an upper surface of the bit line contact, and wherein the second cell interconnection film includes crystal grains oriented in a [002] direction and does not include crystal grains oriented in a [101] direction.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
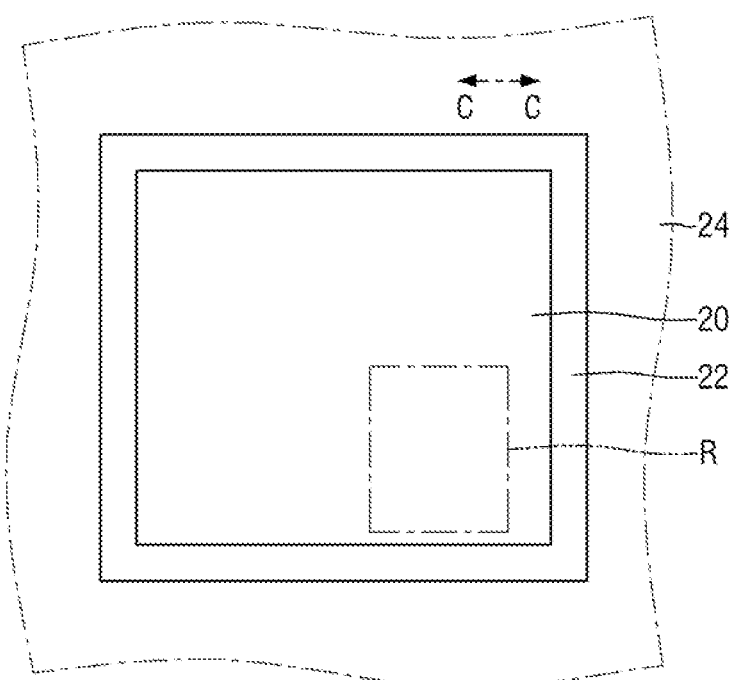
FIG. 1 is a layout diagram of a semiconductor device according to some exemplary embodiments.
Figure 1:
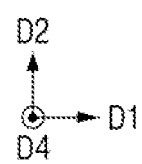

FIG. 1 is an exemplary layout diagram of a semiconductor device according to some exemplary embodiments.

Referring to FIG. 1, the semiconductor device according to some exemplary embodiments may include a cell region 20, a cell region isolation film 22, and a peripheral region 24.

The cell region 20 may be, e.g., a region in which a memory cell is disposed. The cell region isolation film 22 may be along a periphery of the cell region 20. The cell region isolation film 22 may separate the cell region 20 and the peripheral region 24. The peripheral region 24 may be defined as a region around the cell region 20. The peripheral region 24 may be, e.g., a region in which a circuit for operating the memory cell is disposed.

Figure 2:
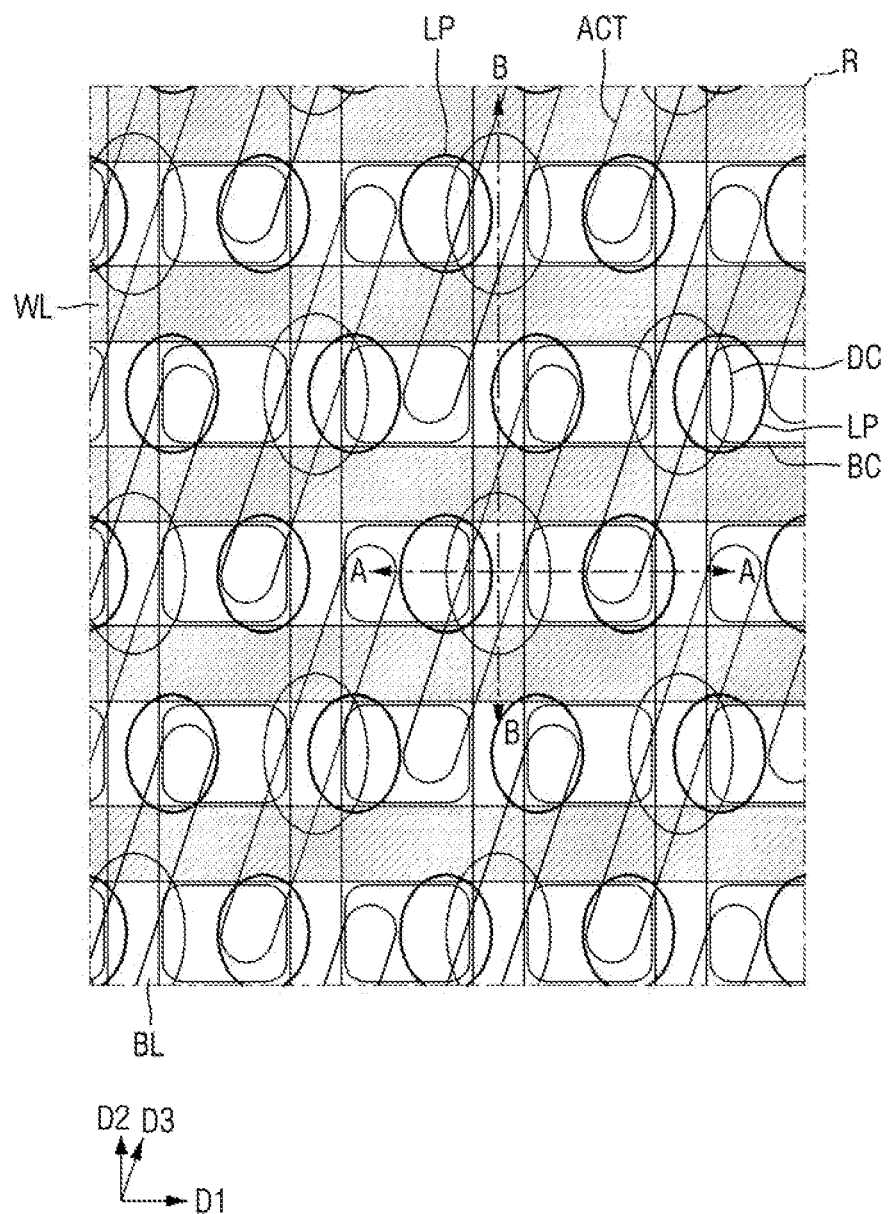
FIG. 2 is an enlarged schematic layout diagram of portion R in FIG. 1.
Figure 3:
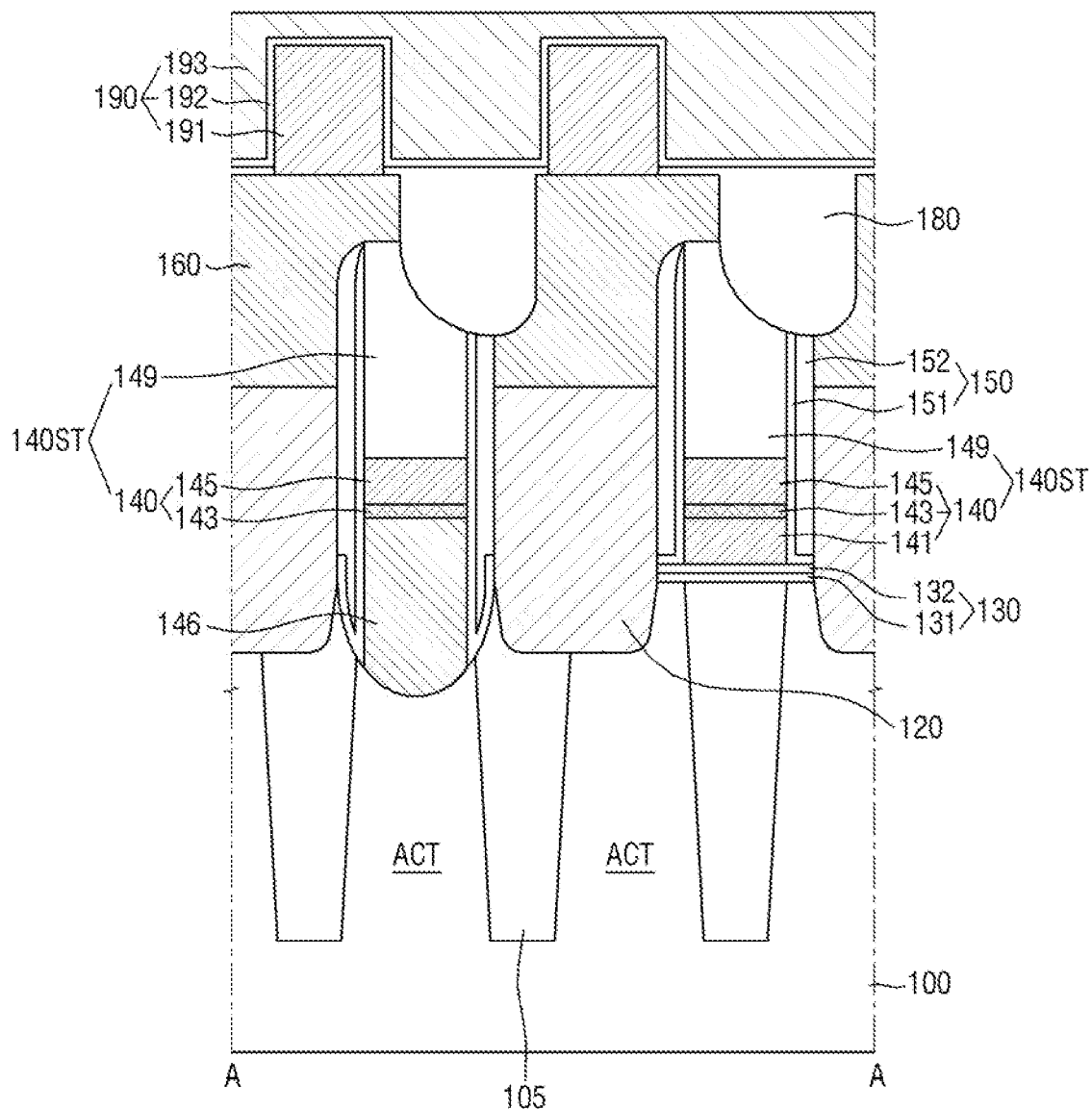
FIG. 3 is a cross-sectional view taken along line A-A in FIG. 2.
Figure 4:
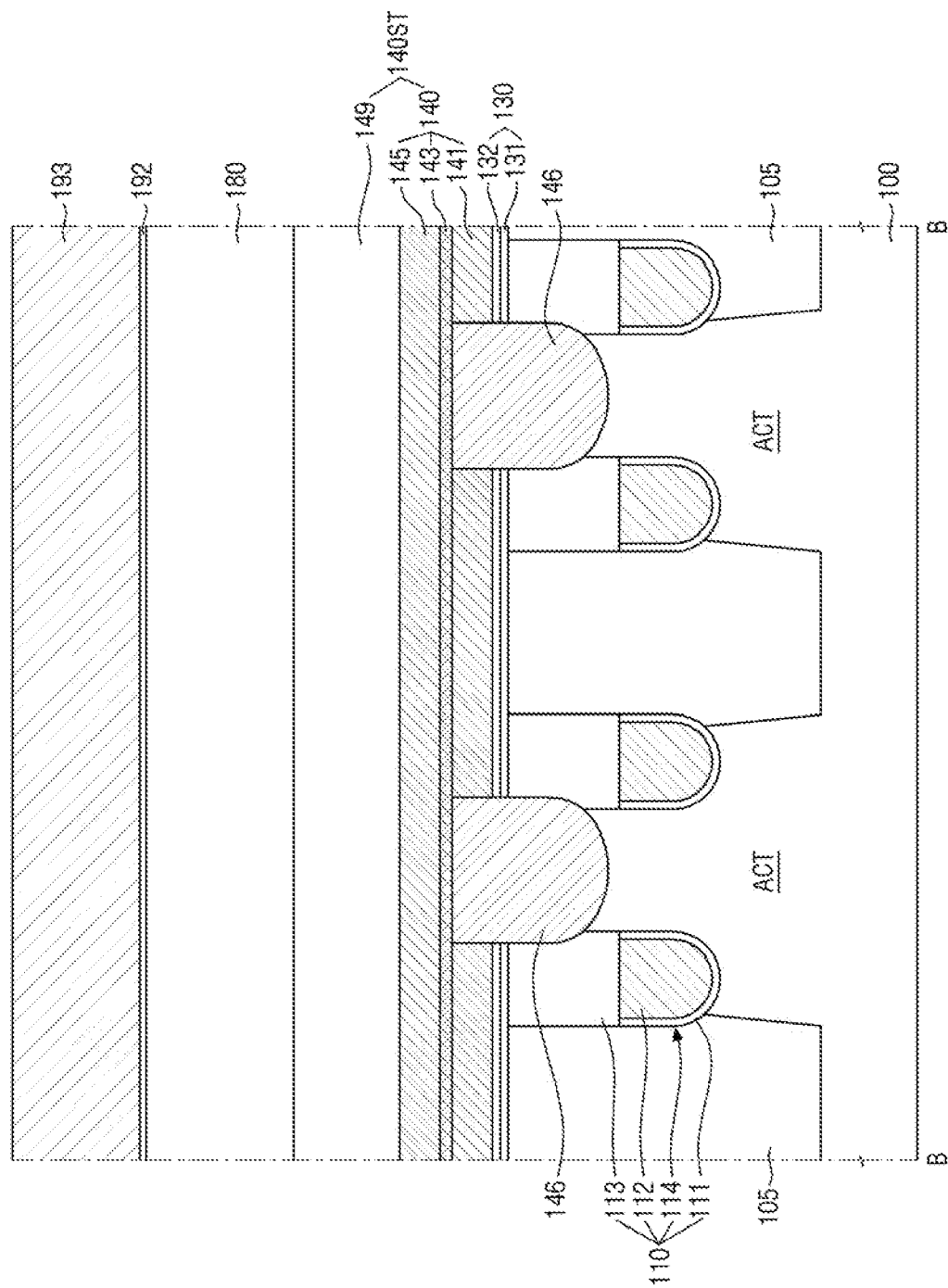
FIG. 4 is a cross-sectional view taken along line B-B in FIG. 2.

FIG. 2 is an enlarged schematic layout diagram of portion R in FIG. 1. FIG. 3 is a cross-sectional view taken along line A-A in FIG. 2. FIG. 4 is a cross-sectional view taken along line B-B in FIG. 2.

For reference, FIG. 2 illustrates an exemplary layout diagram of a dynamic random access memory (DRAM) except for a capacitor structure 190.

Referring to FIG. 2, the semiconductor device according to some exemplary embodiments may include a plurality of active regions ACT. The active region ACT may be defined by an element isolation film 105 (in FIG. 2) in a substrate 100 (in FIG. 2).

As a design rule of the semiconductor device decreases, each of the active regions ACT may have a bar shape of a diagonal line or oblique line as shown in the drawing. The active region ACT may have a bar shape extending (e.g., lengthwise) in a third direction D3.

A plurality of gate electrodes may be on the active region ACT and may extend in a first direction D1 across the active region ACT. The plurality of gate electrodes may extend parallel to each other. The plurality of gate electrodes may be, e.g., a plurality of word lines WL.

The word lines WL may be at equal intervals. A width of each of the word lines WL or an interval between the word lines WL may be determined or selected according to the design rule.

A plurality of bit lines BL extending in a second direction D2 orthogonal to the word lines WL may be on the word lines WL. The plurality of bit lines BL may extend in the second direction D2 across the active regions ACT.

The plurality of bit lines BL may extend parallel to each other. The bit lines BL may be at equal intervals. A width of each of the bit lines BL or an interval between the bit lines BL may be determined or selected according to the design rule.

The semiconductor device according to some exemplary embodiments may include various contact arrangements on the active region ACT. The various contact arrangements may include, e.g., a direct contact DC, a buried contact BC, or a landing pad LP.

In an implementation, the direct contact DC may refer to a contact electrically connecting the active region ACT to the bit line BL. The buried contact BC may refer to a contact connecting the active region ACT to a lower electrode 191 (in FIG. 3) of the capacitor structure 190 (in FIG. 3).

A contact area between the buried contact BC and the active region ACT may be small due to an arrangement structure. In an implementation, the conductive landing pad LP may be included to expand the contact area between the buried contact BC and the active region ACT and to expand a contact area between the buried contact BC and the lower electrode 191 (in FIG. 3) of the capacitor structure 190 (in FIG. 3).

The landing pad LP may be between the active region ACT and the buried contact BC, or may be between the buried contact BC and the lower electrode 191 (in FIG. 2) of the capacitor structure 190 (in FIG. 2). In the semiconductor device according to some exemplary embodiments of the present disclosure, the landing pad LP may be between the buried contact BC and the lower electrode 191 (in FIG. 2) of the capacitor structure 190. Contact resistance between the active region ACT and the lower electrode 191 (in FIG. 2) of the capacitor structure 190 (in FIG. 2) may be reduced by expanding the contact area through the introduction of the landing pad LP.

In the semiconductor device according to some exemplary embodiments, the direct contact DC may be in a central portion of the active region ACT. The buried contact BC may be at both end portions of the active region ACT.

As the buried contacts BC are at both end portions of the active region ACT, the landing pads LP may be adjacent to both end portions of the active region ACT to partially overlap the buried contacts BC.

In an implementation, the buried contact BC may overlap the active region ACT and the element isolation film 105 (in FIG. 3) between adjacent word lines WL and between adjacent bit lines BL.

The word line WL may be in a structure buried in the substrate 100. The word line WL may be across the active region ACT between the direct contacts DC or the buried contacts BC.

In an implementation, two word lines WL may cross one active region ACT. In an implementation, the active region ACT may have a diagonal shape or arrangement, and the word line WL may have or form an angle of less than 90 degrees with respect to the active region ACT.

The direct contact DC and the buried contact BC may be symmetrically disposed. In an implementation, the direct contact DC and the buried contact BC may be on a straight line in the first direction D1 and the second direction D2.

In an implementation, unlike the direct contact DC and the buried contact BC, the landing pad LP may be disposed in a zigzag shape in the second direction D2 in which the bit line BL extends. In an implementation, the landing pad LP may overlap the same side surface portion of each bit line BL in the first direction D1 in which the word line WL extends.

In an implementation, each of the landing pads LP of a first line may overlap a left side surface of the corresponding bit line BL, and each of the landing pads LP of a second line may overlap a right side surface of the corresponding bit line BL.

Referring to FIGS. 2 to 4, the semiconductor device according to some exemplary embodiments may include the element isolation film 105, a plurality of gate structures 110, a plurality of bit line structures 140ST, a bit line contact 146, a storage contact 120, a storage pad 160, and the capacitor structure 190.

The substrate 100 may be a silicon substrate or a silicon-on-insulator (SOI). In an implementation, the substrate 100 may include silicon germanium, a silicon germanium on insulator (SGOI), indium antimonide, a lead tellurium compound, indium arsenic, indium phosphide, gallium arsenide, or gallium antimonide. As used herein, the term "or" is not an exclusive term, e.g., "A or B" would include A, B, or A and B.

The element isolation film 105 may be in the substrate 100. The element isolation film 105 may have a shallow trench isolation (STI) structure having superior element isolation characteristics. The element isolation film 105 may define the active region ACT in the substrate 100. The element isolation film 105 may be included in the substrate 100.

The active region ACT defined by the element isolation film 105 may have a long, e.g., oblong, island shape including a short axis and a long axis as shown in FIG. 2. The active region ACT may have a diagonal shape or arrangement so as to have or form an angle of less than 90 degrees with respect to the word line WL (e.g., in the element isolation film 105).

In an implementation, the active region ACT may have a diagonal arrangement so as to have an angle of less than 90 degrees with respect to the bit line BL on the element isolation film 105. In an implementation, the active region ACT may extend in the third direction D3 having a predetermined angle with respect to the first direction D1 and the second direction D2.

The element isolation film 105 may include, e.g., a silicon oxide film, a silicon nitride film, or a silicon oxynitride film. In an implementation, the element isolation film 105 may be a single film. In an implementation, the element isolation film 105 may include an insulation liner and a filling insulation film filling a trench defined by the insulation liner.

In an implementation, as illustrated in FIG. 3, an upper surface of the element isolation film 105 and an upper surface of the substrate 100 corresponding to the active region ACT may be on the same plane, or may be on different planes.

The gate structure 110 may be in or on the substrate 100 and the element isolation film 105. The gate structure 110 may extend across the element isolation film 105 and the active region ACT (defined by the element isolation film 105). In an implementation, one gate structure 110 may be in or on the substrate 100 and the element isolation film 105 positioned in the first direction D1 in which the gate structure 110 extends.

The gate structure 110 may include a gate trench 114, a gate insulation film 111, a gate electrode 112, and a gate capping pattern 113 in or on the substrate 100 and the element isolation film 105. In an implementation, the gate electrode 112 may correspond to the word line WL.

The gate insulation film 111 may extend along a sidewall and a bottom surface of the gate trench 114. The gate insulation film 111 may extend along at least a part of a profile of the gate trench 114.

The gate insulation film 111 may include, e.g., silicon oxide, silicon nitride, silicon oxynitride, or a high dielectric constant material having a dielectric constant greater than that of silicon oxide. The high dielectric constant material may include, e.g., boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

In an implementation, the high dielectric constant material may include a nitride (e.g., hafnium nitride) or an oxynitride (e.g., hafnium oxynitride) of the above-described metallic material (e.g., hafnium).

The gate electrode 112 may be on the gate insulation film 111. The gate electrode 112 may fill a part of the gate trench 114.

The gate electrode 112 may include, e.g., a metal (e.g., a non-compounded metal), a conductive metal nitride, a conductive metal carbonitride, a conductive metal carbide, a metal silicide, a doped semiconductor material, a conductive metal oxynitride, or a conductive metal oxide. The gate electrode 112 may include, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium Aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), Nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof.

The gate capping pattern 113 may be on the gate electrode 112. The gate capping pattern 113 may fill the remaining gate trench 114 except for the portion in which the gate electrode 112 is formed. The gate capping pattern 113 may include, e.g., silicon nitride (SiN), silicon oxynitride (SiON), silicon oxide (SiO$_2$), silicon carbonitride (SiCN), silicon oxycarbonitride (SiOCN), or combinations thereof.

In an implementation, as illustrated in FIG. 3, an upper surface of the gate capping pattern 113 and an upper surface of the element isolation film 105 may be on the same plane, or may be on different planes.

In an implementation, the gate insulation film 111 may not extend to the upper surface of the gate capping pattern 113, or may extend to the upper surface of the gate capping pattern 113.

In an implementation, an impurity doped region may be on at least one side of the gate structure 110. The impurity doped region may be a source/drain region of a transistor.

The bit line structure 140ST may include a cell interconnection structure 140 and a cell capping film 144.

The cell interconnection structure 140 may be on the substrate 100 and the element isolation film 105 (on which the gate structure 110 is formed). The cell interconnection structure 140 may cross the element isolation film 105 and the active region ACT defined by the element isolation film 105.

In an implementation, one cell interconnection structure 140 may be on the substrate 100 and the element isolation film 105 positioned in the second direction D2 in which the cell interconnection structure 140 extends. The cell interconnection structure 140 may cross the gate structure 110. In an implementation, the cell interconnection structure 140 may correspond to the bit line BL.

In an implementation, the cell interconnection structure 140 may be a single film, or may be multiple films, as shown in the drawing. In a region overlapping an upper surface of the bit line contact 146, the cell interconnection structure 140 may include a first cell interconnection film 143 and a second cell interconnection film 145 sequentially stacked on the substrate 100. In a region not overlapping the upper surface of the bit line contact 146, the cell interconnection structure 140 may include a third cell interconnection film 141, the first cell interconnection film 143, and the second cell interconnection film 145 sequentially stacked on the substrate 100. In a fabricating process, after forming the third cell interconnection film 141 on the substrate 100, when forming the bit line contact 146 passing through the third cell interconnection film 141, the cell interconnection structure 140 may have the same structure as described above.

In an implementation, in the region overlapping the upper surface of the bit line contact 146, the cell interconnection structure 140 may include the third cell interconnection film 141, the first cell interconnection film 143, and the second cell interconnection film 145. In the fabricating process, after forming the bit line contact 146, when the third cell interconnection film 141 is formed on the substrate 100 and the bit line contact 146, a shape different from that shown in FIG. 3 may be formed.

The first cell interconnection film 143 may be on the substrate 100 and the element isolation film 105. The first cell interconnection film 143 may be elongated in (e.g., may have a long axis extending along) the second direction D2.

The first cell interconnection film 143 may include an amorphous material or ruthenium (Ru). The amorphous material may include, e.g., ruthenium silicide (RuSix), ruthenium nitride (RuN), ruthenium oxide (RuO$_2$), magnesium oxide (MgO$_2$), titanium oxide (TiO$_2$), or graphene. In an implementation, the first cell interconnection film 143 may be formed of or include, e.g., ruthenium, ruthenium silicide, ruthenium nitride, ruthenium oxide, magnesium oxide, titanium oxide, or graphene.

The first cell interconnection film 143 may include ruthenium reduced from ruthenium nitride or ruthenium oxide. The ruthenium nitride or the ruthenium oxide may be reduced by an annealing process during the fabricating process of the semiconductor device. In this case, the first cell interconnection film 143 may include only ruthenium (e.g., non-compounded ruthenium), or may also include a low or negligible concentration of nitrogen or oxygen.

When the first cell interconnection film 143 includes ruthenium, the first cell interconnection film 143 according to some exemplary embodiments may include crystal grains oriented in a different direction from the second cell interconnection film 145 or crystal grains oriented in the same direction as the second cell interconnection film 145. In an implementation, the first cell interconnection film 143 may also include ruthenium of an amorphous material.

The second cell interconnection film 145 may be on the first cell interconnection film 143. The second cell interconnection film 145 may be elongated or may extend along the first cell interconnection film 143 in the second direction D2. The second cell interconnection film 145 may be in contact (e.g., direct contact) with the first cell interconnection film 143. In an implementation, a thickness (e.g., in a fourth direction D4) of the second cell interconnection film 145 may be larger than a thickness of the first cell interconnection film 143.

The second cell interconnection film 145 may include, e.g., ruthenium (Ru), rhodium (Rh), iridium (Ir), molybdenum (Mo), RuAl, NiAl, NbB$_2$, MoB$_2$, TaB$_2$, V$_2$AlC, or CrAlC.

In the semiconductor device according to some exemplary embodiments, the second cell interconnection film 145 may be formed of or include ruthenium (e.g., non-compounded ruthenium). In an implementation, the first cell interconnection film 143 may help increase a size of crystal grains of the second cell interconnection film 145.

When the second cell interconnection film 145 includes ruthenium, the size of the crystal grains of the second cell interconnection film 145 on the first cell interconnection film 143 may be larger than a size of crystal grains of the second cell interconnection film 145 formed without the first cell interconnection film 143. As the size of crystal grains increases, grain boundaries between the crystal grains may decrease. The grain boundaries may act as resistance of electron transfer, and as the size of the crystal grains of the second cell interconnection film 145 increases, a resistance of the second cell interconnection film 145 may decrease. In an implementation, the first cell interconnection film 143 may help reduce the resistance of the second cell interconnection film 145.

In the semiconductor device according to some exemplary embodiments, the first cell interconnection film 143 may include ruthenium, and the second cell interconnection film 145 may be formed of ruthenium. In an implementation, the first cell interconnection film 143 may be formed of ruthenium or ruthenium nitride, and the second cell interconnection film 145 may be formed of ruthenium. In an implementation, the second cell interconnection film 145 may include crystal grains oriented in the [002] direction and may not include crystal grains oriented in the [101] direction. At least a part of the first cell interconnection film 143 may include crystal grains oriented along the crystal grains of the second cell interconnection film 145. In an implementation, the first cell interconnection film 143 may include the crystal grains oriented in the [002] direction.

The third cell interconnection film 141 may be between the substrate 100 and the first cell interconnection film 143. The third cell interconnection film 141 may extend in the second direction D2 along the first cell interconnection film 143. The third cell interconnection film 141 may be in contact (e.g., direct contact) with the first cell interconnection film 143.

The third cell interconnection film 141 may include, e.g., a semiconductor material doped with impurities. The third cell interconnection film 141 may include, e.g., impurity-doped silicon, impurity-doped silicon germanium, or impurity-doped germanium.

The bit line contact 146 may be between the substrate 100 and the cell interconnection structure 140. In an implementation, the cell interconnection structure 140 may be on the bit line contact 146.

In an implementation, the bit line contact 146 may be at a point in which the cell interconnection structure 140 crosses a center part of the active region ACT having an oblong island shape. The bit line contact 146 may be between the substrate 100 and the cell interconnection structure 140 in the center part of the active region ACT.

The bit line contact 146 may electrically connect the cell interconnection structure 140 and the substrate 100. The bit line contact 146 may electrically connect the cell interconnection structure 140 and the active region ACT. In an implementation, the bit line structure 140ST may be connected to the active region ACT through the bit line contact 146.

In an implementation, the bit line contact 146 may electrically connect the impurity-doped region of the substrate 100 between adjacent gate structures 110 and the cell interconnection structure 140. In an implementation, the bit line contact 146 may correspond to the direct contact DC.

In an implementation, a bottom surface of the bit line contact 146 may be above (e.g., farther from the substrate 100 in the fourth direction D4 than) an upper surface of the gate electrode 112. A depth from the upper surface of the gate capping pattern 113 to the bottom surface of the bit line contact 146 may be smaller than a depth from the upper surface of the gate capping pattern 113 to the upper surface of the gate electrode 112.

The bit line contact 146 may include, e.g., a semiconductor material doped with impurities, a conductive silicide compound, a conductive metal nitride, or a metal. In the semiconductor device according to some exemplary embodiments, the bit line contact 146 may include a semiconductor material doped with impurities.

A cell capping film 149 may be on the cell interconnection structure 140. The cell capping film 149 may extend in the second direction D2 on or along the second cell interconnection film 145. The cell capping film 149 may include, e.g., silicon nitride, silicon oxynitride, or silicon oxide. In an implementation, the cell capping film 149 may be a single film, or may be multiple films. In an implementation, when each of the films constituting the multiple films is made of the same material, the cell capping film 149 may be viewed as the single film.

A cell insulation film 130 may be on the substrate 100 and the element isolation film 105. In an implementation, the cell insulation film 130 may be on the substrate 100 and the element isolation film 105 (e.g., on or at an area of which the bit line contact 146 is not formed).

In an implementation, the cell insulation film 130 may be a single film, or the cell insulation film 130 may be multiple films including a first cell insulation film 131 and a second cell insulation film 132. In an implementation, the first cell insulation film 131 may include an oxide film, and the second cell insulation film 132 may include a nitride film.

A spacer structure 150 may be on sidewalls of the cell interconnection structure 140 and the cell capping film 149. The spacer structure 150 may be on the substrate 100 and the element isolation film 105 in a part of the cell interconnection structure 140 in which the bit line contact 146 is formed. The spacer structure 150 may extend in the second direction D2 on the sidewalls of the cell interconnection structure 140 and the cell capping film 149.

In an implementation, in the remaining portion of the cell interconnection structure 140 in which the bit line contact 146 is not formed, the spacer structure 150 may be on the cell insulation film 130. The spacer structure 150 may extend in the second direction D2 on the sidewalls of the cell interconnection structure 140 and the cell capping film 149.

In an implementation, the spacer structure 150 may be a single film, or the spacer structure 150 may be multiple films including a first spacer 151 and a second spacer 152. In an implementation, the first spacer 151 and the second spacer 152 may include, e.g., a silicon oxide film, a silicon nitride film, a silicon oxynitride film (SiON), a silicon oxycarbonitride film (SiOCN), air, or a combination thereof.

The storage contact 120 may be between adjacent cell interconnection structures 140. The storage contact 120 may overlap the substrate 100 and the element isolation film 105 between the adjacent cell interconnection structures 140. Here, the storage contact 120 may correspond to the buried contact BC.

The storage contact 120 may include, e.g., a semiconductor material doped with impurities, a conductive silicide compound, a conductive metal nitride, or a metal.

The storage pad 160 may be on the storage contact 120. The storage pad 160 may be electrically connected to the storage contact 120. Here, the storage pad 160 may correspond to the landing pad LP.

The storage pad 160 may overlap a part of an upper surface of the bit line structure 140ST. The storage pad 160 may include, e.g., a semiconductor material doped with impurities, a conductive silicide compound, a conductive metal nitride, or a metal.

An interlayer insulation film 180 may be on the storage pad 160 and the bit line structure 140ST. In an implementation, the interlayer insulation film 180 may be on the cell capping film 144.

The interlayer insulation film 180 may define a region of the storage pad 160 forming a plurality of isolated regions. In an implementation, the interlayer insulation film 180 may be patterned to expose a part of an upper surface of the storage pad 160.

The interlayer insulation film 180 may include an insulating material to electrically isolate a plurality of storage pads 160 from each other. In an implementation, the interlayer insulation film 180 may include, e.g., a silicon oxide film, a silicon nitride film, a silicon oxynitride film, or a combination thereof.

The capacitor structure 190 may be on the interlayer insulation film 180 and the storage pad 160. The capacitor structure 190 may be connected to a part of the upper surface of the storage pad 160 exposed as the interlayer insulation film 180 is not formed. In an implementation, the capacitor structure 190 may be electrically connected to the storage contact 120.

In an implementation, the capacitor structure 190 may include the lower electrode 191, a capacitor insulation film 192, and an upper electrode 193. The capacitor structure 190 may store electric charge in the capacitor insulation film 192, using a potential difference generated between the lower electrode 191 and the upper electrode 193.

The lower electrode 191 may be on the storage pad 160. In an implementation, as illustrated in the drawings, the lower electrode 191 may have a pillar shape. In an implementation, the lower electrode 191 may have a cylindrical shape.

The capacitor insulation film 192 may be on the lower electrode 191. The capacitor insulation film 192 may be along a profile of the lower electrode 191.

The upper electrode 193 may be on the capacitor insulation film 192. The upper electrode 193 may surround an outer wall of the lower electrode 191.

Each of the lower electrode 191 and the upper electrode 193 may include, e.g., a doped semiconductor material, a conductive metal nitride (e.g., titanium nitride, tantalum nitride, niobium nitride, tungsten nitride, or the like), a metal (e.g., ruthenium, iridium, titanium, tantalum, or the like), or a conductive metal oxide (e.g., iridium oxide, niobium oxide, or the like).

The capacitor insulation film 192 may include, e.g., silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

Figure 5:
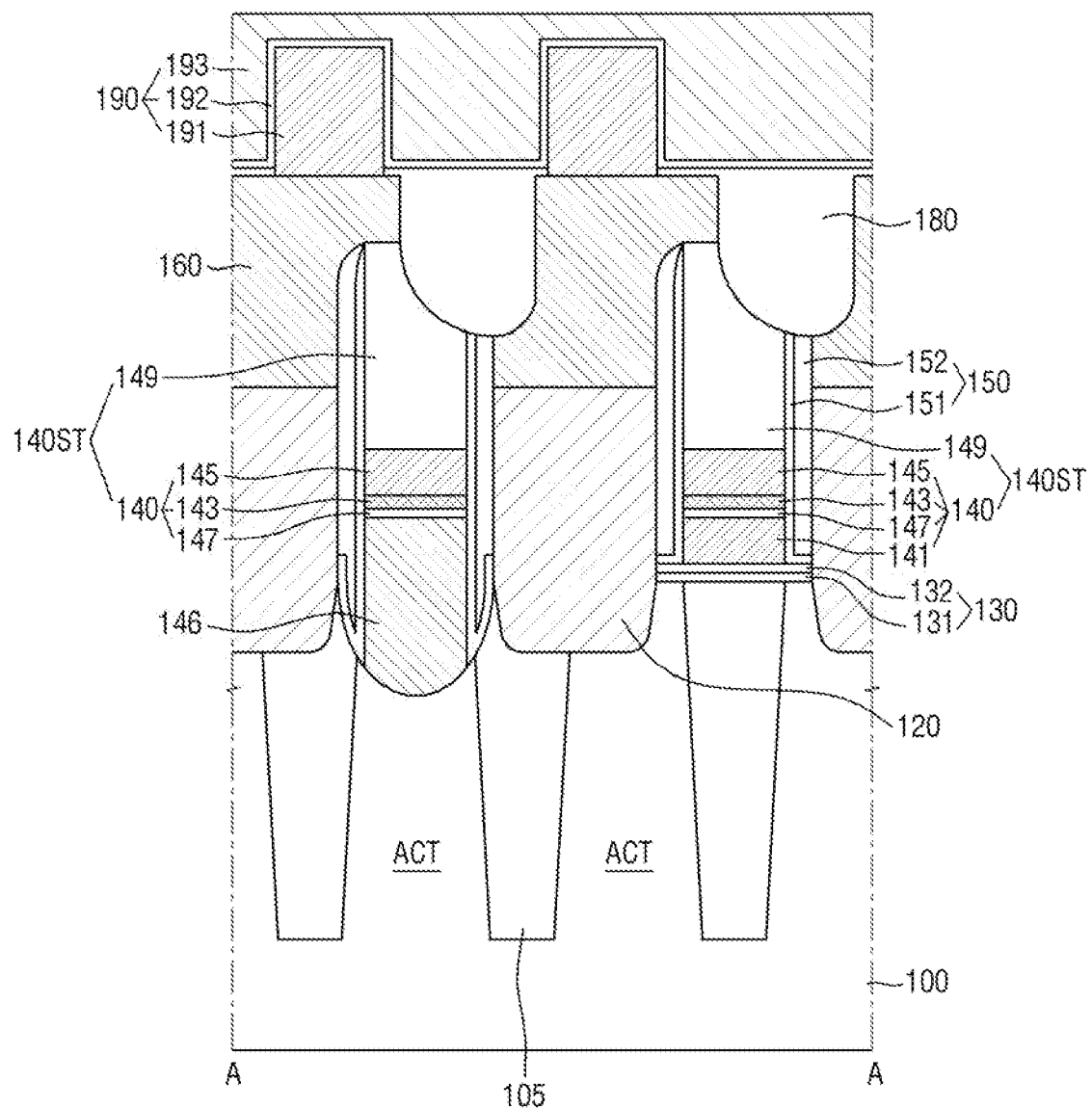
FIGS. 5 and 6 are views of a semiconductor device according to some exemplary embodiments.
Figure 6:
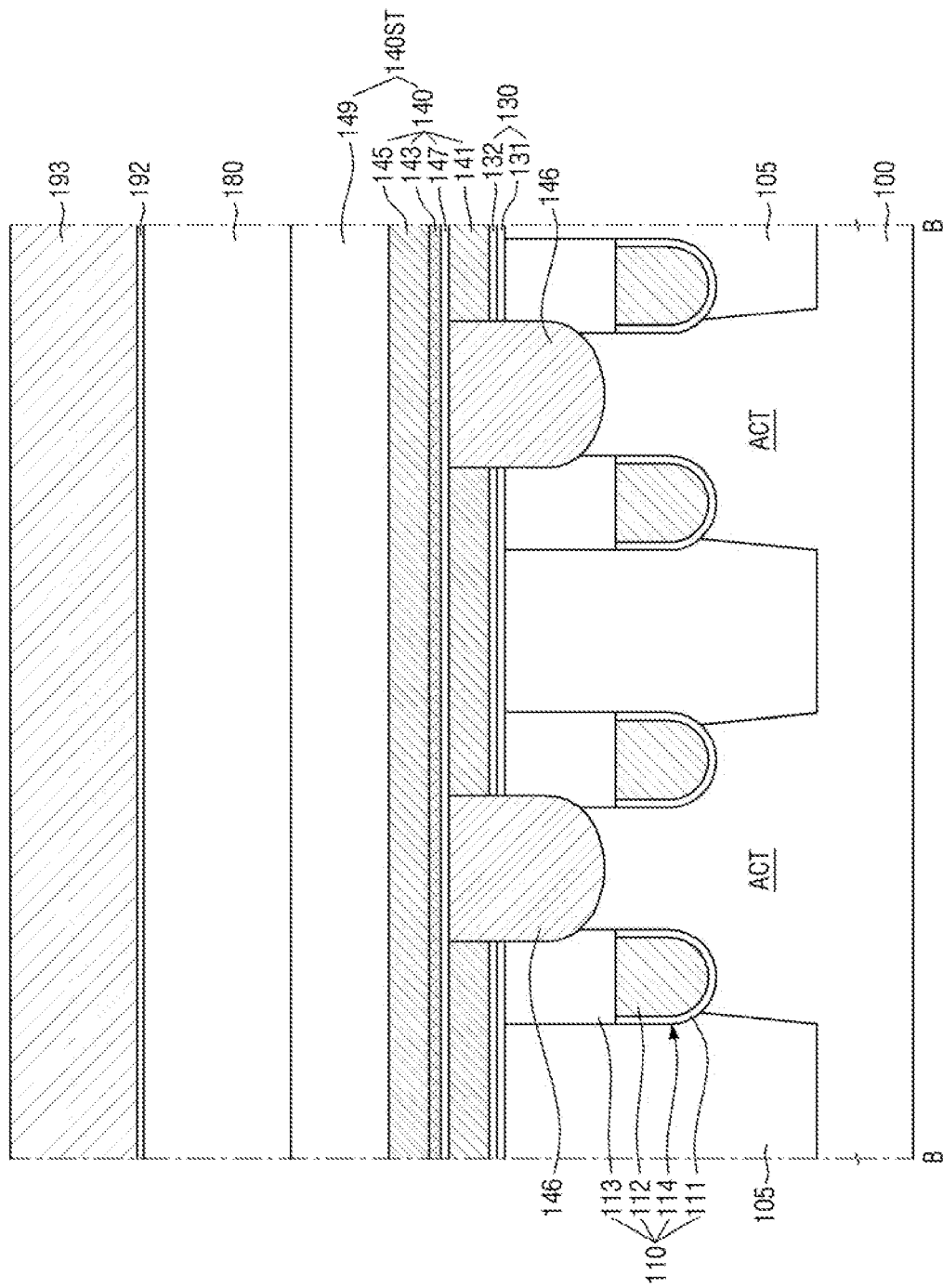

FIGS. 5 and 6 are views of a semiconductor device according to some exemplary embodiments. For convenience of description, the description will focus on differences from those described with reference to FIGS. 1 to 4. For reference, FIG. 5 is a cross-sectional view taken along line A-A in FIG. 2, and FIG. 6 is a cross-sectional view taken along line B-B in FIG. 2.

Referring to FIGS. 5 and 6, in the semiconductor device according to some exemplary embodiments, the cell interconnection structure 140 may further include a cell metal silicide film 147.

In a region overlapping the upper surface of the bit line contact 146, the cell interconnection structure 140 may include the cell metal silicide film 147, the first cell interconnection film 143, and the second cell interconnection film 145 sequentially stacked on the substrate 100. In a region not overlapping the upper surface of the bit line contact 146, the cell interconnection structure 140 may include the third cell interconnection film 141, the cell metal silicide film 147, the first cell interconnection film 143, and the second cell interconnection film 145 sequentially stacked on the substrate 100.

The cell metal silicide film 147 may be between the third cell interconnection film 141 and the first cell interconnection film 143. The cell metal silicide film 147 may extend in the second direction D2 along the first cell interconnection film 143. The cell metal silicide film 147 may be in contact (e.g., direct contact) with the first cell interconnection film 143.

The cell metal silicide film 147 may be on the bit line contact 146. The cell metal silicide film 147 may extend in the second direction D2 along the third cell interconnection film 141. The cell metal silicide film 147 may be in contact (e.g., direct contact) with the third cell interconnection film 141 and the bit line contact 146.

The cell metal silicide film 147 may include, e.g., titanium (Ti) silicide, cobalt (Co) silicide, nickel (Ni) silicide, molybdenum (Mo) silicide, ruthenium (Ru) silicide, or tungsten (W) silicide.

Figure 7:
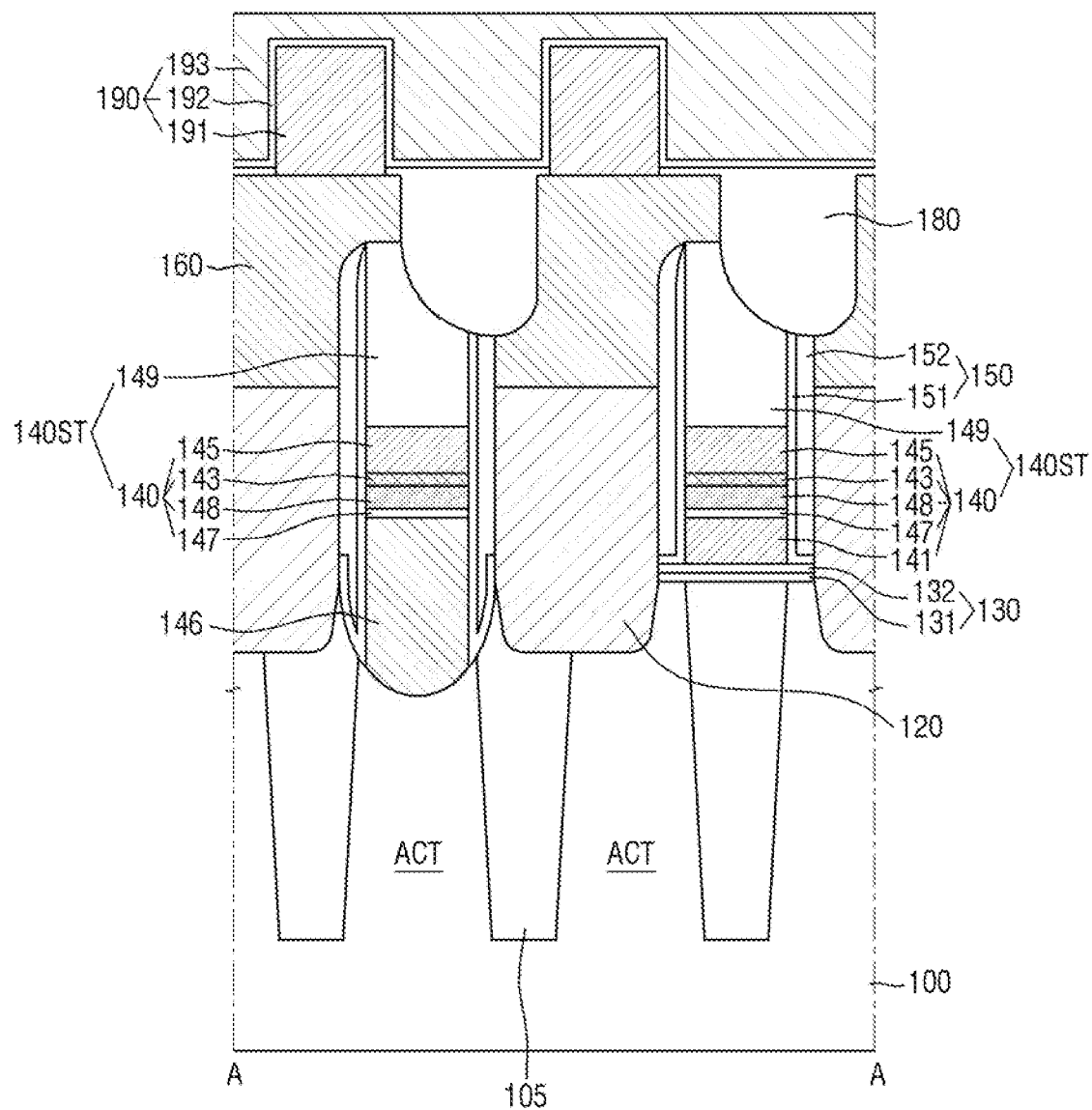
FIGS. 7 to 9 are views of the semiconductor device according to some exemplary embodiments.
Figure 8:
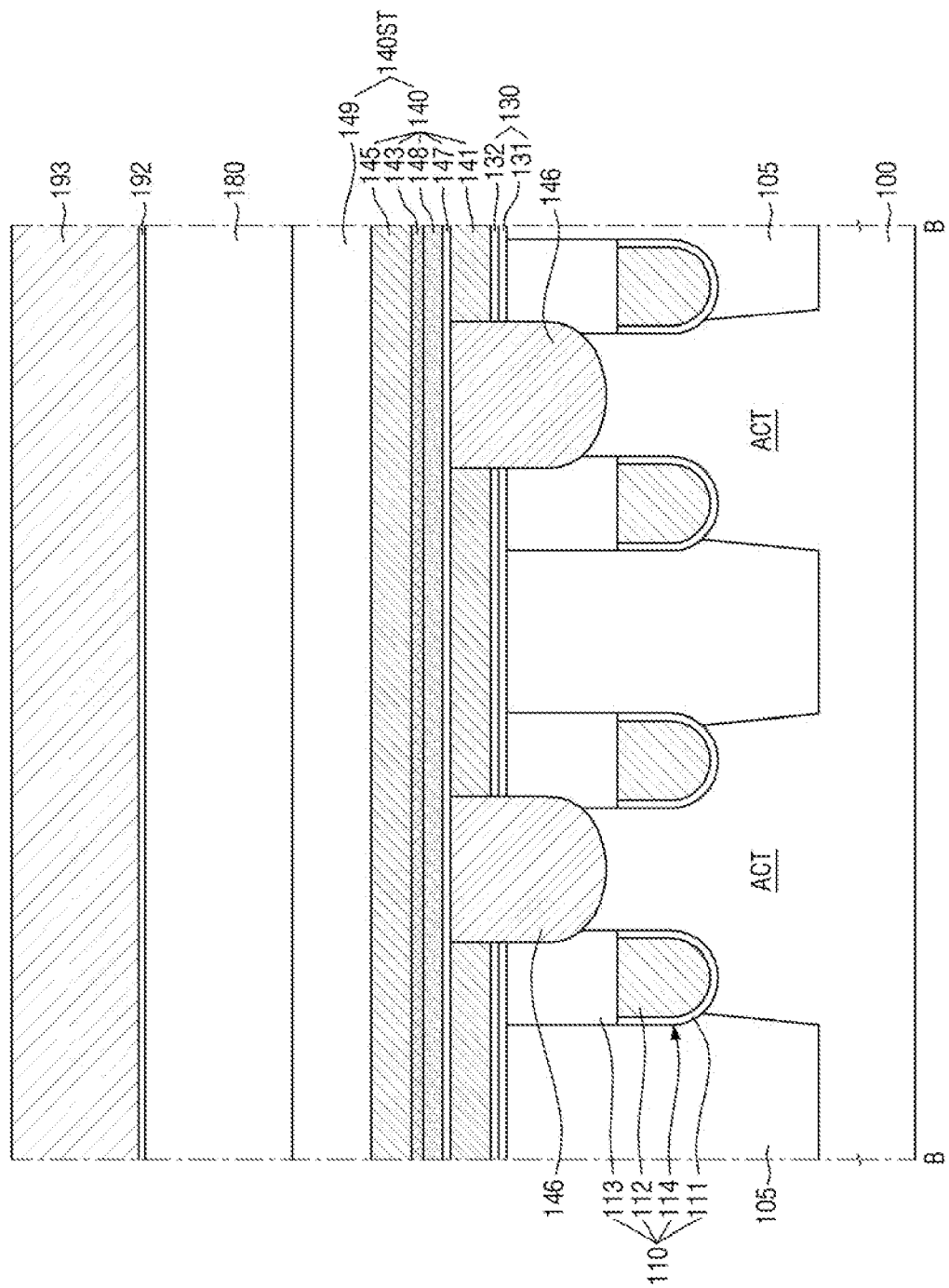
Figure 9:
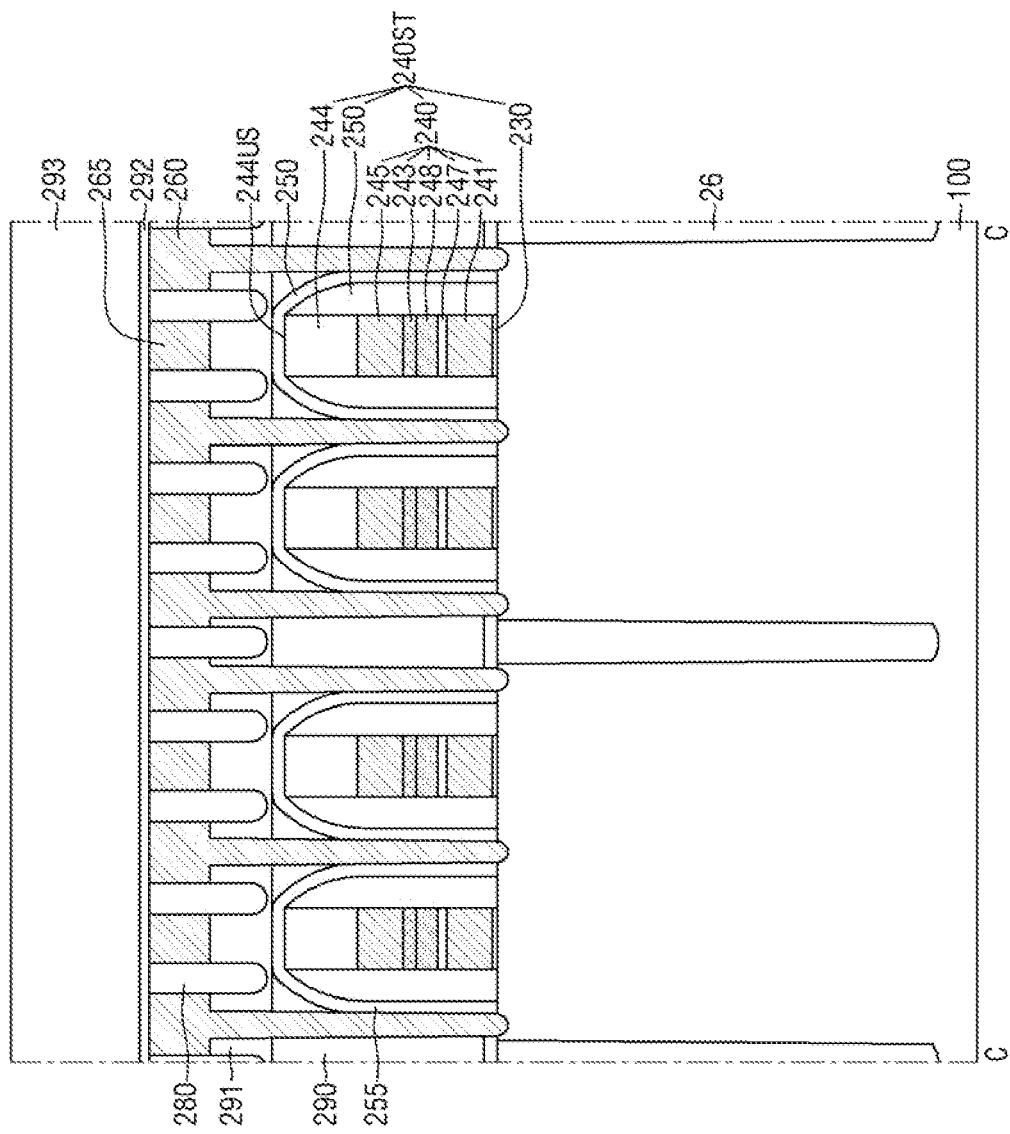

FIGS. 7 to 9 are views of a semiconductor device according to some exemplary embodiments. For convenience of description, the description will focus on differences from those described with reference to FIGS. 5 and 6. For reference, FIG. 7 is a cross-sectional view taken along line A-A in FIG. 2, FIG. 8 is a cross-sectional view taken along line B-B in FIG. 2, and FIG. 9 is a cross-sectional view taken along line C-C in FIG. 1.

Referring to FIGS. 7 and 8, in the semiconductor device according to some exemplary embodiments, the cell interconnection structure 140 may further include a cell barrier film 148.

In a region overlapping the upper surface of the bit line contact 146, the cell interconnection structure 140 may include the cell metal silicide film 147, the cell barrier film 148, the first cell interconnection film 143, and the second cell interconnection film 145 sequentially stacked on the substrate 100. In a region not overlapping the upper surface of the bit line contact 146, the cell interconnection structure 140 may include the third cell interconnection film 141, the cell metal silicide film 147, the cell barrier film 148, the first cell interconnection film 143, and the second cell interconnection film 145 sequentially stacked on the substrate 100.

The cell barrier film 148 may be between the cell metal silicide film 147 and the first cell interconnection film 143. The cell barrier film 148 may extend in the second direction D2 along the cell metal silicide film 147. The cell barrier film 148 may be in contact (e.g., direct contact) with the cell metal silicide film 147. The cell barrier film 148 may extend in the second direction D2 along the first cell interconnection film 143. The cell barrier film 148 may be in contact (e.g., direct contact) with the first cell interconnection film 143.

The cell barrier film 148 may include, e.g., tantalum (Ta), tantalum nitride (TaN), tantalum silicon nitride (TaSiN), titanium (Ti), titanium nitride (TiN), titanium silicon nitride (TiSiN), tungsten (W), tungsten nitride (WN), tungsten silicon nitride (WSiN), or graphene.

In an implementation, as illustrated in the drawings, the cell barrier film 148 may be a single film, or may be multiple films. In an implementation, when each film constituting the multiple films is made of the same material, the cell barrier film 148 may be shown as the single film.

In an implementation, a thickness of the cell metal silicide film 147 may be 10 Å to 30 Å. A thickness of the cell barrier film 148 may be 20 Å to 50 Å. A thickness of the first cell interconnection film 143 may be 10 Å to 30 Å. A thickness of the second cell interconnection film 145 may be 150 Å or more. The thickness of the cell metal silicide film 147, the thickness of the cell barrier film 148, the thickness of the first cell interconnection film 143, and the thickness of the second cell interconnection film 145 may be different from each other depending on materials included in the cell metal silicide film 147, the cell barrier film 148, the first cell interconnection film 143, and the second cell interconnection film 145.

Referring to FIG. 9, the semiconductor device according to some exemplary embodiments may further include a peripheral gate structure 240ST.

The peripheral gate structure 240ST may be on the substrate 100 at the peripheral region 24. The peripheral gate structure 240ST may be on a peripheral active region defined by a peripheral element isolation film 26. In an implementation, as illustrated in the drawings, two peripheral gate structures 240ST may be between the peripheral element isolation films 26 adjacent to each other.

The peripheral gate structure 240ST may include a peripheral gate insulation film 230, a peripheral interconnection structure 240, and a peripheral capping film 244 sequentially stacked on the substrate 100. The peripheral gate structure 240ST may include a peripheral spacer 250 on a sidewall of the peripheral interconnection structure 240 and a sidewall of the peripheral capping film 244.

The peripheral gate insulation film 230 may include, e.g., silicon oxide, silicon oxynitride, silicon nitride, or a high dielectric constant (high-k) material having a dielectric constant greater than that of silicon oxide. In an implementation, the peripheral gate insulation film 230 may be at the same level as the cell insulation film 130.

The peripheral interconnection structure 240 may include a third peripheral interconnection film 241, a peripheral metal silicide film 247, a peripheral barrier film 248, a first peripheral interconnection film 243, and a second peripheral interconnection film 245 sequentially stacked on the peripheral gate insulation film 230.

The third peripheral interconnection film 241 may be on the peripheral gate insulation film 230. The peripheral metal silicide film 247 may be on the third peripheral interconnection film 241. The peripheral metal silicide film 247 may extend along the third peripheral interconnection film 241.

The peripheral barrier film 248 may be on the peripheral metal silicide film 247. The peripheral barrier film 248 may extend along the peripheral metal silicide film 247. The peripheral barrier film 248 may be in contact (e.g., direct contact) with the peripheral metal silicide film 247.

The first peripheral interconnection film 243 may be on the peripheral barrier film 248. The first peripheral interconnection film 243 may extend along the peripheral barrier film 248. The first peripheral interconnection film 243 may be in contact (e.g., direct contact) with the peripheral barrier film 248.

The second peripheral interconnection film 245 may be on the first peripheral interconnection film 243. The second peripheral interconnection film 245 may extend along the first peripheral interconnection film 243. The second peripheral interconnection film 245 may be in contact (e.g., direct contact) with the first peripheral interconnection film 243.

In an implementation, the peripheral metal silicide film 247, the peripheral barrier film 248, the first peripheral interconnection film 243, and the second peripheral interconnection film 245 may be at the same level as the cell metal silicide film 147, the cell barrier film 148, the first cell interconnection film 143, and the second cell interconnection film 145, respectively, e.g., by the same fabricating process. In an implementation, the peripheral metal silicide film 247, the peripheral barrier film 248, the first peripheral interconnection film 243, and the second peripheral interconnection film 245 may include the same material as the cell metal silicide film 147, the cell barrier film. 148, the first cell interconnection film 143, and the second cell interconnection film 145, respectively.

Figure 10:
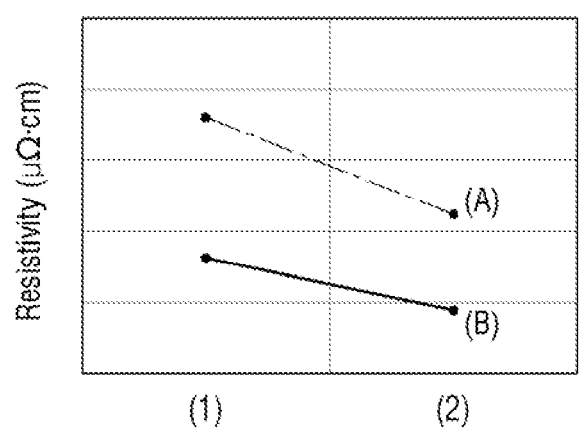
FIG. 10 is a graph showing resistivity of a second cell interconnection film in the semiconductor device according to some embodiments.

FIG. 10 is a graph showing resistivity of the second cell interconnection film in the semiconductor device according to some exemplary embodiments and a comparative embodiment.

Referring to FIGS. 2, 3, and 10, dash-single dotted line (A) shows resistivity of a second cell interconnection film when the second cell interconnection film is formed without a first cell interconnection film, and solid line (B) shows resistivity of the second cell interconnection film 145 when the second cell interconnection film 145 is formed on the first cell interconnection film 143. Portion (1) shows resistivity before the annealing process is performed, and portion (2) shows resistivity after the annealing process is performed. In (1), the first cell interconnection film 143 includes ruthenium nitride (RuN), and in (2), the first cell interconnection film 143 is reduced to include ruthenium, and may further include a low or negligible concentration of nitrogen. The second cell interconnection film 145 includes ruthenium.

The resistivity of the second cell interconnection film before the annealing process is performed when the second cell interconnection film is formed on the first cell interconnection film is smaller than the resistivity of the second cell interconnection film before the annealing process is performed when the second cell interconnection film is formed without the first cell interconnection film.

The resistivity of the second cell interconnection film after the annealing process is performed when the second cell interconnection film is formed on the first cell interconnection film may be smaller than the resistivity of the second cell interconnection film after the annealing process is performed when the second cell interconnection film is formed without the first cell interconnection film.

Figure 11:
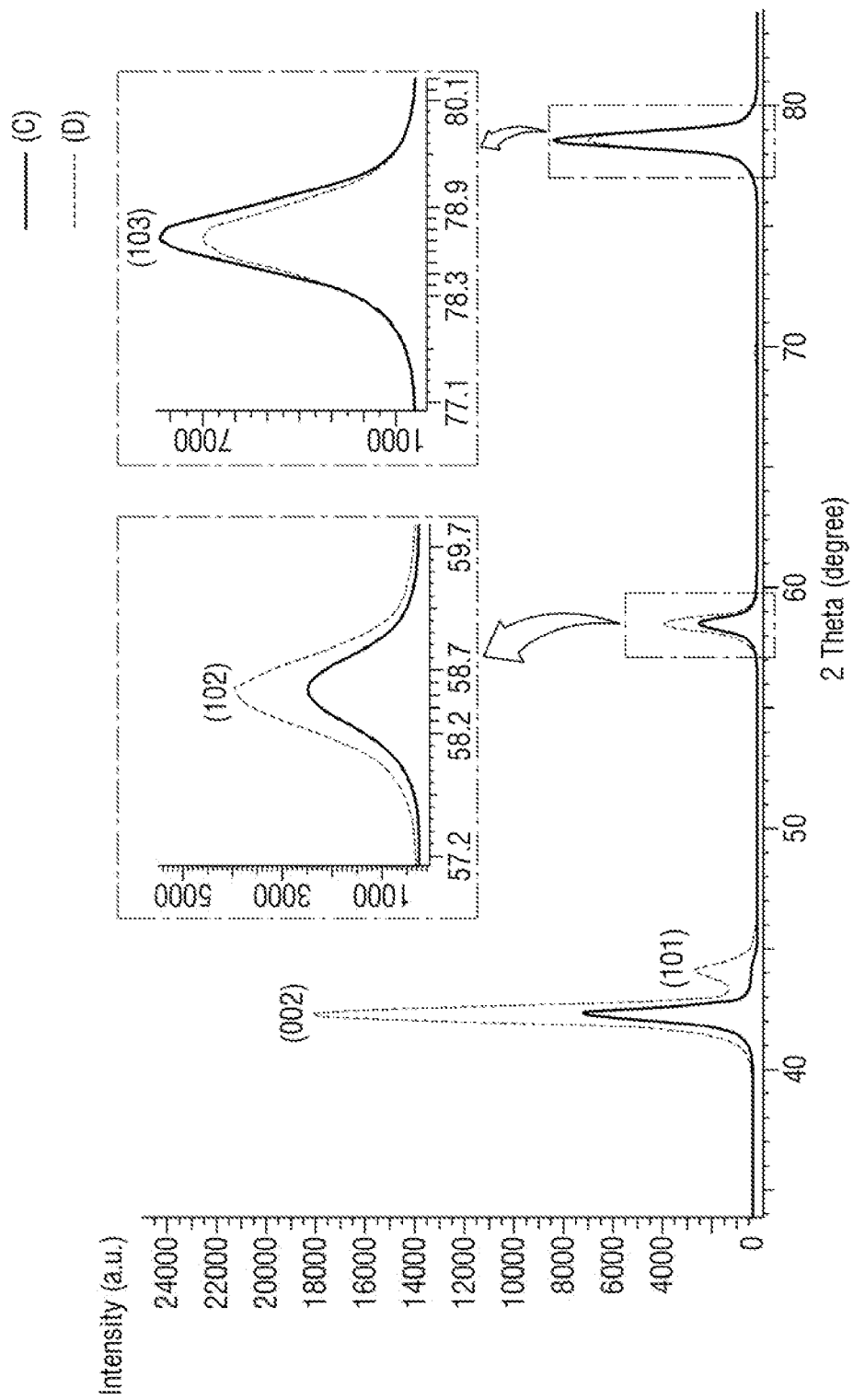
FIG. 11 is a graph showing a result of X-ray diffraction (XRD) analysis of the second cell interconnection film in the semiconductor device according to some embodiments.

FIG. 11 is a graph showing a result of X-ray diffraction (XRD) analysis of the second cell interconnection film in the semiconductor device according to some exemplary embodiments and a comparative embodiment.

Referring to FIG. 11, solid line (C) shows a case in which the second cell interconnection film is formed without the first cell interconnection film, and dotted line (D) shows a case in which the second cell interconnection film is formed on the first cell interconnection film. The first cell interconnection film may include ruthenium nitride (RuN) before the annealing process is performed on the semiconductor device, may be reduced after the annealing process is performed to include ruthenium, and may further include a low or negligible concentration of nitrogen. The second cell interconnection film may include ruthenium.

When the second cell interconnection film is formed without the first cell interconnection film (solid line C), the second cell interconnection film may include crystal grains oriented in the [002] direction and crystal grains oriented in the [101] direction.

On the other hand, when the second cell interconnection film is formed on the first cell interconnection film (dotted line D), the second cell interconnection film may include the crystal grains oriented in the [002] direction, and may not include the crystal grains oriented in the [101] direction.

Figure 12:
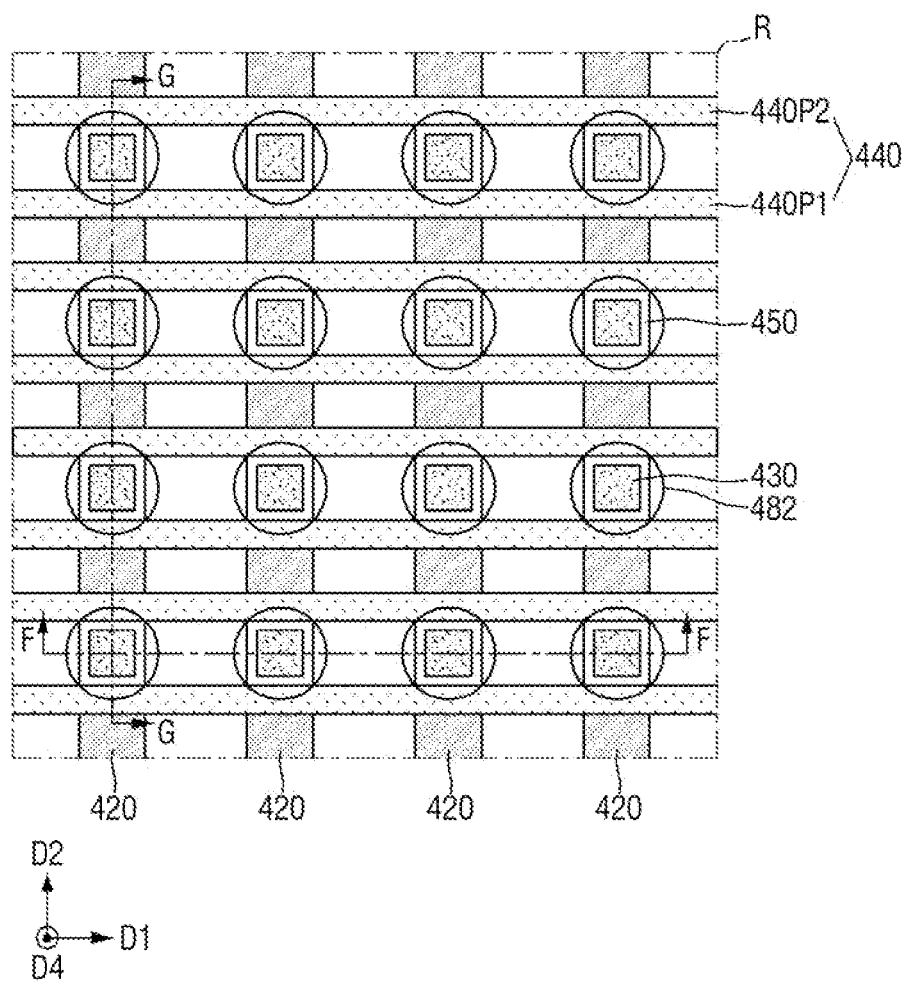
FIG. 12 is a schematic layout diagram of a semiconductor memory device according to some exemplary embodiments.
Figure 13:
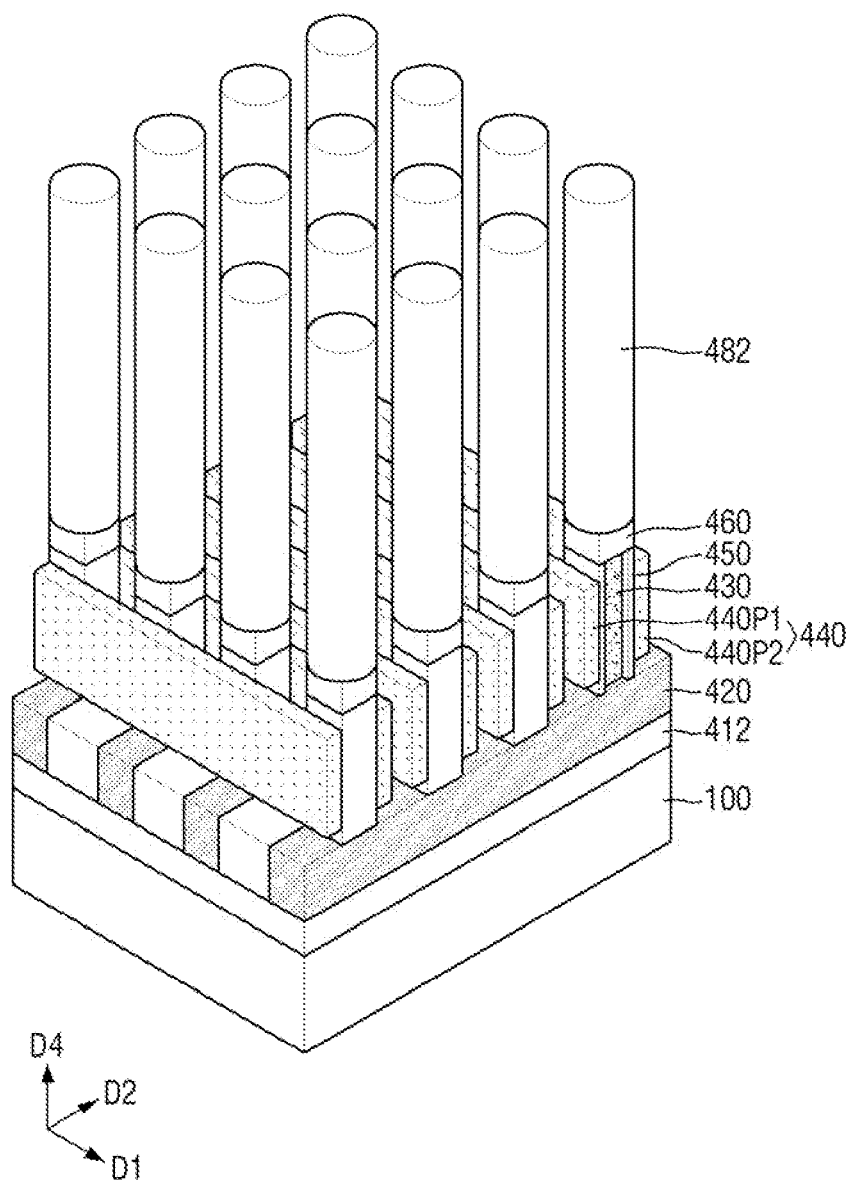
FIG. 13 is a schematic perspective view of the semiconductor memory device according to some exemplary embodiments.
Figure 14:
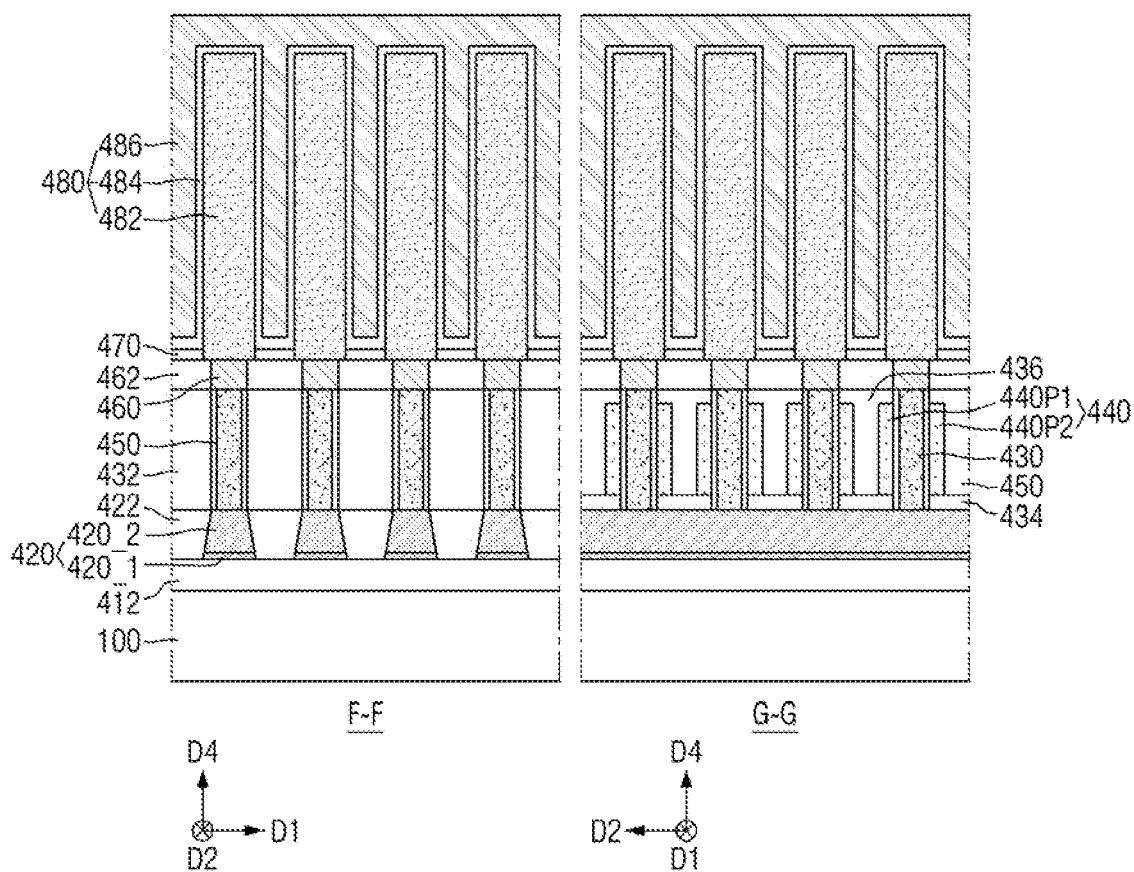
FIG. 14 is a cross-sectional view taken along lines F-F and G-G in FIG. 12.

FIG. 12 is a schematic layout diagram of a semiconductor memory device according to some exemplary embodiments. FIG. 13 is a schematic perspective view of the semiconductor memory device according to some exemplary embodiments. FIG. 14 is a cross-sectional view taken along lines F-F and G-G in FIG. 12. For reference, FIG. 12 may be an enlarged view of portion R in FIG. 2.

Referring to FIGS. 12 to 14, the semiconductor memory device according to some exemplary embodiments may include a substrate 100, a plurality of first conductive lines 420, a channel layer 430, a gate electrode 440, a gate insulation film 450, and a capacitor 480. The semiconductor memory device according to some exemplary embodiments may be a memory device including a vertical channel transistor (VCT). The vertical channel transistor may refer to a structure in which a channel length of the channel layer 430 extends in a vertical direction from the substrate 100.

A lower insulation layer 412 may be on the substrate 100. The plurality of first conductive lines 420 may be spaced apart from each other in the first direction D1 and may extend in the second direction D2 on the lower insulation layer 412. A plurality of first insulation patterns 422 may be on the lower insulation layer 412 so as to fill spaces between the plurality of first conductive lines 420. The plurality of first insulation patterns 422 may extend in the second direction D2. Upper surfaces of the plurality of first insulation patterns 422 may be at the same level as upper surfaces of the plurality of first conductive lines 420. The plurality of first conductive lines 420 may function as bit lines.

In an implementation, the first conductive line 420 may include a first interconnection film 420_1 and a second interconnection film 420_2.

The first interconnection film 420_1 may be on the first insulation pattern 422. The second interconnection film 4202 may be on the first interconnection film 420_1. The second interconnection film 4202 may extend in the second direction D2 along the first interconnection film 420_1. The second interconnection film 420_2 may be in contact (e.g., direct contact) with the first interconnection film 420_1.

The first interconnection film 420_1 may correspond to the first cell interconnection film 143 described above, and the second interconnection film 420_2 may correspond to the second cell interconnection film 145 described above.

In an implementation, a width of the first conductive line 420 in the first direction D1 may decrease as a distance from the substrate 100 increases. This may be caused by a process of forming the first conductive line 420.

The channel layer 430 may be arranged in a matrix form, e.g., spaced apart in the first direction D1 and the second direction D2 on the plurality of first conductive lines 420. The channel layer 430 may have a first width in the first direction D1 and a first height in the fourth direction D4, and the first height may be larger than the first width. Here, the fourth direction D4 crosses the first direction D1 and the second direction D2, and may be, e.g., a direction perpendicular to an upper surface of the substrate 100. In an implementation, the first height may be about 2 to 10 times the first width. A bottom part of the channel layer 430 may function as a third source/drain region, an upper part of the channel layer 430 may function as a fourth source/drain region, and a part of the channel layer 430 between the third and fourth source/drain regions may function as a channel region.

In an implementation, the channel layer 430 may include an oxide semiconductor. In an implementation, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. The channel layer 430 may include a single layer or multiple layers of the oxide semiconductor. In an implementation, the channel layer 430 may have a bandgap energy greater than that of silicon. In an implementation, the channel layer 430 may have a band gap energy of about 1.5 eV to 5.6 eV. In an implementation, the channel layer 430 may have optimal channel performance when the channel layer 430 has a band gap energy of about 2.0 eV to 4.0 eV. In an implementation, the channel layer 430 may be polycrystalline or amorphous. In an implementation, the channel layer 430 may include graphene, carbon nanotubes, or a combination thereof.

The gate electrode 440 may extend in the first direction D1 on both sidewalls of the channel layer 430. The gate electrode 440 may include a first sub-gate electrode 440P1 facing a first sidewall of the channel layer 430 and a second sub-gate electrode 440P2 facing a second sidewall opposite to the first sidewall of the channel layer 430. In an implementation, one channel layer 430 may be between the first sub-gate electrode 440P1 and the second sub-gate electrode 440P2, and the semiconductor device may have a dual gate transistor structure. In an implementation, the second sub-gate electrode 440P2 may be omitted and only the first sub-gate electrode 440P1 facing the first sidewall of the channel layer 430 may be formed to realize a single gate transistor structure. A material included in the gate electrode 440 may be the same as description of that of the gate electrode 112.

The gate insulation film 450 may surround the sidewall of the channel layer 430, and may be between the channel layer 430 and the gate electrode 440. In an implementation, as shown in FIG. 12, the entire sidewall of the channel layer 430 may be surrounded by the gate insulation film 450, and a part of the sidewall of the gate electrode 440 may be in contact with the gate insulation film 450. In an implementation, the gate insulation film 450 may extend in an extending direction of the gate electrode 440 (i.e., the first direction D1), and only two sidewalls facing the gate electrode 440 among the sidewalls of the channel layer 430 may be in contact with the gate insulation film 450. In an implementation, the gate insulation film 450 may include a silicon oxide film, a silicon oxynitride film, a high dielectric constant material having a dielectric constant greater than that of silicon oxide film, or a combination thereof.

A plurality of second insulation patterns 432 may extend in the second direction D2 on the plurality of first insulation patterns 422. The channel layer 430 may be between two adjacent second insulation patterns 432 of the plurality of second insulation patterns 432. In an implementation, a first buried layer 434 and a second buried layer 436 may be in a space between two adjacent channel layers 430 between the two adjacent second insulation patterns 432. The first buried layer 434 may be at a bottom part of the space between two adjacent channel layers 430. The second buried layer 436 may fill the rest of the space between two adjacent channel layers 430 on the first buried layer 434. An upper surface of the second buried layer 436 may be at the same level as an upper surface of the channel layer 430, and the second buried layer 436 may cover an upper surface of the gate electrode 440. In an implementation, the plurality of second insulation patterns 432 may be formed as a material layer continuous with the plurality of first insulation patterns 422, or the second buried layer 436 may also be formed as a material layer continuous with the first buried layer 434.

Capacitor contacts 460 may be on the channel layer 430. The capacitor contacts 460 may be vertically overlap the channel layer 430, and may be arranged in a matrix form, e.g., spaced apart from each other in the first direction D1 and the second direction D2. Each of the capacitor contacts 460 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof. An upper insulation film 462 may surround a sidewall of the capacitor contact 460 on the plurality of second insulation patterns 432 and the second buried layer 436.

A third etching stop film 470 may be on the upper insulation film 462. The capacitor 480 may be on the third etching stop film 470. The capacitor 480 may include a second lower electrode 482, a second capacitor dielectric layer 484, and a second upper electrode 486. The second lower electrode 482 may pass through the third etching stop film 470 to be electrically connected to an upper surface of the capacitor contact 460. The second lower electrode 482 may be a pillar type extending in the fourth direction D4. In an implementation, the second lower electrodes 482 may vertically overlap the capacitor contact 460, and may be arranged in a matrix form, e.g., spaced apart from each other in the first direction D1 and the second direction D2. In an implementation, a landing pad may be between the capacitor contact 460 and the second lower electrode 482 so that the second lower electrode 482 may be arranged in a hexagonal shape.

Figure 15:
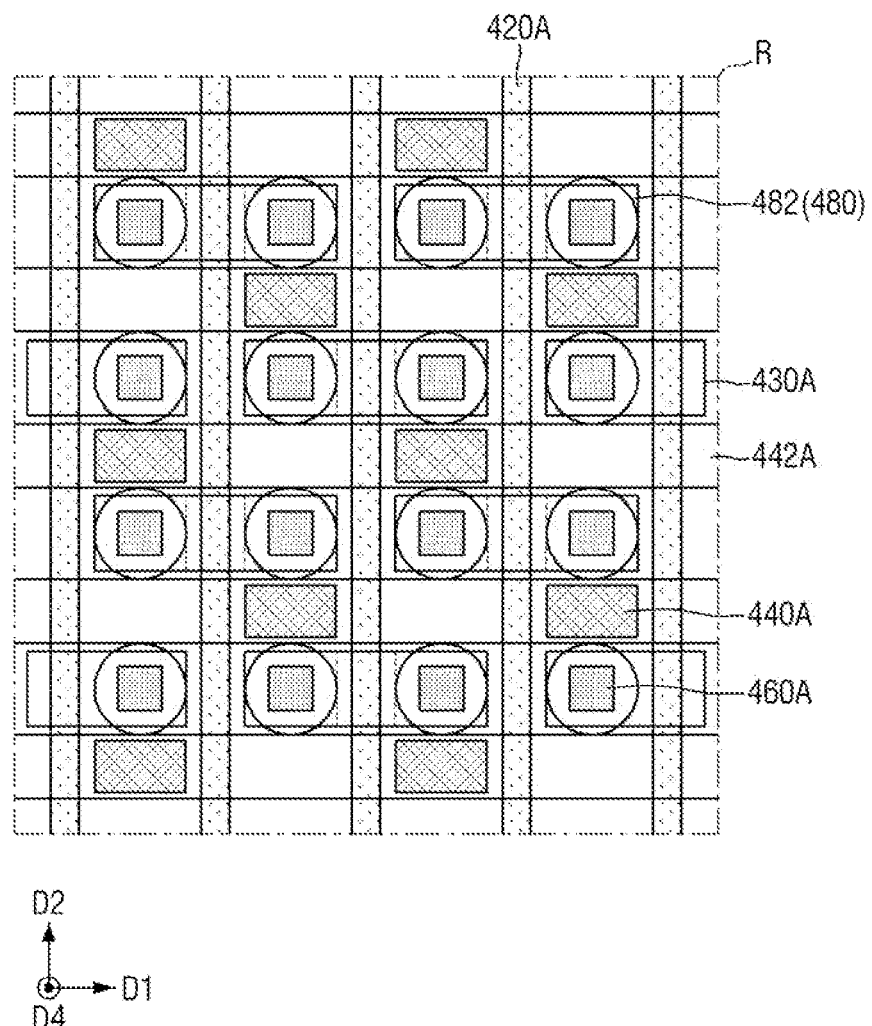
FIG. 15 is a schematic layout diagram of a semiconductor device according to some exemplary embodiments.
Figure 16:
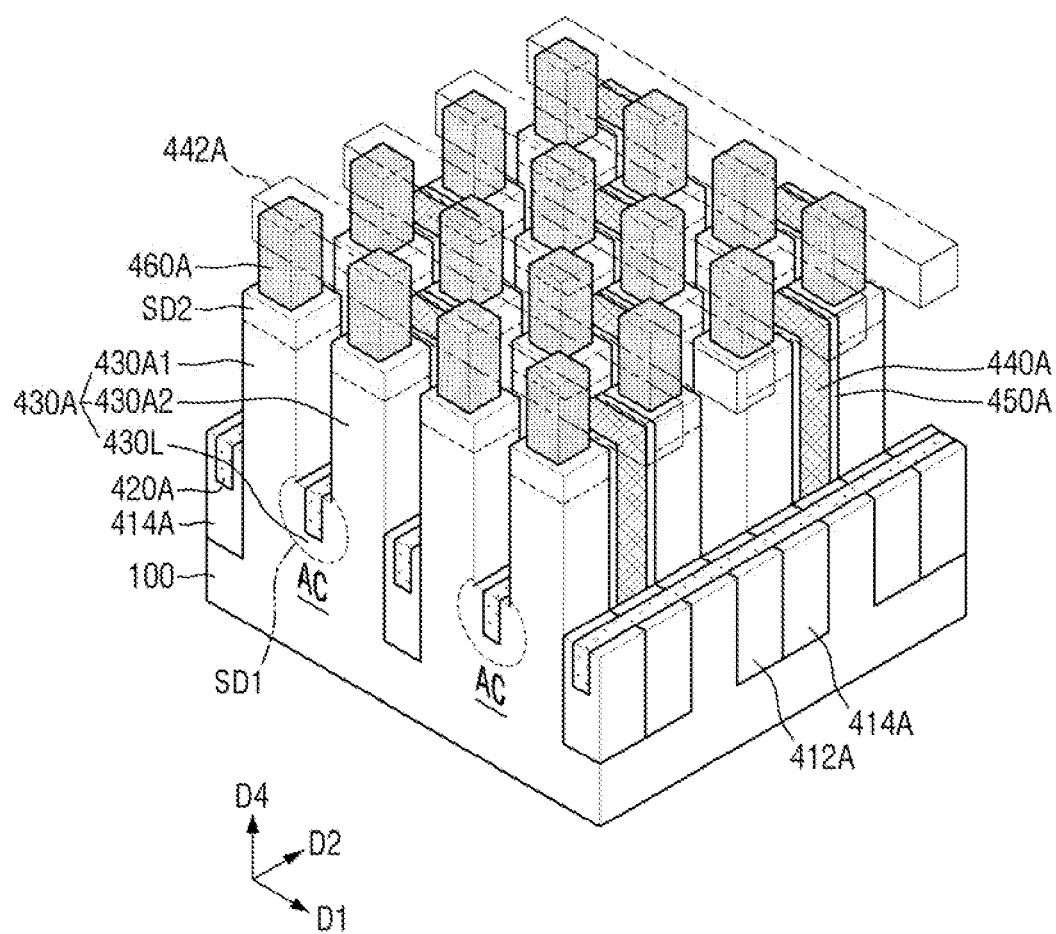
FIG. 16 is a schematic perspective view of the semiconductor device according to some exemplary embodiments.

FIG. 15 is a schematic layout diagram of a semiconductor device according to some exemplary embodiments. FIG. 16 is a schematic perspective view of the semiconductor device according to some exemplary embodiments. For reference, FIG. 15 is an enlarged view of portion R in FIG. 2.

Referring to FIGS. 15 and 16, the semiconductor device according to some exemplary embodiments may include a substrate 100, a plurality of first conductive lines 420A, a channel structure 430A, a contact gate electrode 440A, a plurality of second conductive lines 442A, and a second capacitor 480. The semiconductor device according to some exemplary embodiments may be a memory device including a vertical channel transistor (VCT).

A plurality of second active regions AC may be defined on the substrate 100 by a first element isolation pattern 412A and a second element isolation pattern 414A. The channel structure 430A may be in each of the second active regions AC. The channel structure 430A may include a first active pillar 430A1 and a second active pillar 430A2 each extending in a vertical direction and a connection part 430L connected to a bottom portion of the first active pillar 430A1 and a bottom portion of the second active pillar 430A2. A fifth source/drain region SD1 may be in the connection part 430L. A sixth source/drain region SD2 may be at an upper portion of each of the first and second active pillars 430A1 and 430A2. The first active pillar 430A1 and the second active pillar 430A2 may each form an independent unit memory cell.

The plurality of first conductive lines 420A may extend in a direction crossing the plurality of second active regions AC, respectively, e.g., may extend in the second direction D2. One first conductive line 420A among the plurality of first conductive lines 420A may be on the connection part 430L between the first and second active pillars 430A1 and 430A2. One first conductive line 420A may be on the fifth source/drain region SD1. Another first conductive line 420A adjacent to one first conductive line 420A may be between two channel structures 430A. One first conductive line 420A of the plurality of first conductive lines 420A may function as a common bit line included in two unit memory cells formed by the first active pillar 430A1 and the second active pillar 430A2 on both sides of the one first conductive line 420A.

In an implementation, the first conductive line 420A may include the first cell interconnection film 143 and the second cell interconnection film 145 described above.

One contact gate electrode 440A may be between the two adjacent channel structures 430A in the second direction D2. In an implementation, the contact gate electrode 440A may be between the first active pillar 430A1 included in one channel structure 430A and the second active pillar 430A2 of the channel structure 430A adjacent thereto. One contact gate electrode 440A may be shared by the first active pillar 430A1 and the second active pillar 430A2 on both sidewalls of the contact gate electrode 440A. A fourth gate insulation film 450A may be between the contact gate electrode 440A and the first active pillar 430A1 and between the contact gate electrode 440A and the second active pillar 430A2. The plurality of second conductive lines 442A may extend in the first direction D1 on an upper surface of the contact gate electrode 440A. The plurality of second conductive lines 442A may function as word lines of a semiconductor device.

A capacitor contact 460A may be on the channel structure 430A. The capacitor contact 460A may be on the sixth source/drain region SD2, and the second capacitor 480 may be on the capacitor contact 460A.

FIGS. 17 to 24 are views of stages in a method of fabricating a semiconductor device according to some exemplary embodiments. For reference, FIGS. 17 to 24 are cross-sectional views taken along line A-A in FIG. 2.

Figure 17:
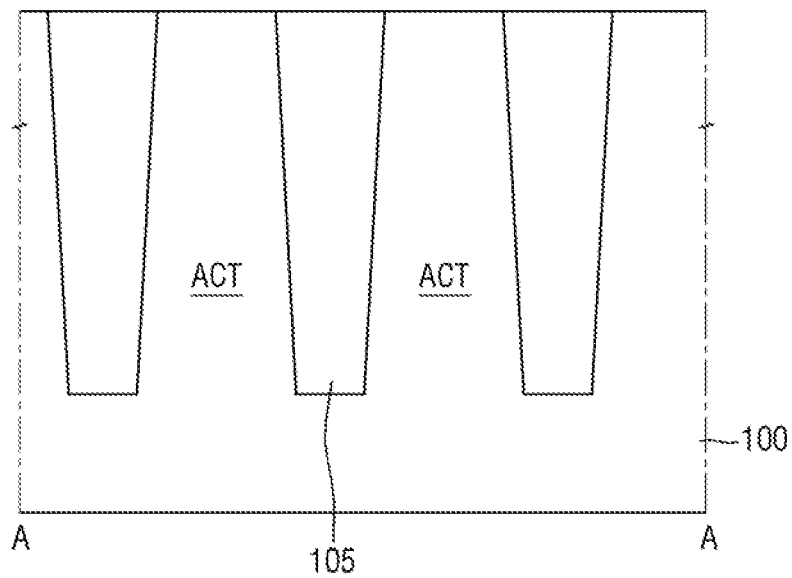
FIGS. 17 to 24 are views of stages in a method of fabricating a semiconductor device according to some exemplary embodiments.

Referring to FIG. 17, an element isolation film 105 may be formed in a substrate 100 according to some exemplary embodiments. The substrate 100 may include an active region ACT defined by the element isolation film 105.

In an implementation, an element isolation trench may be formed in the substrate 100. The element isolation trench may be filled with an insulating material to form the element isolation film 105 in the substrate 100.

Figure 18:
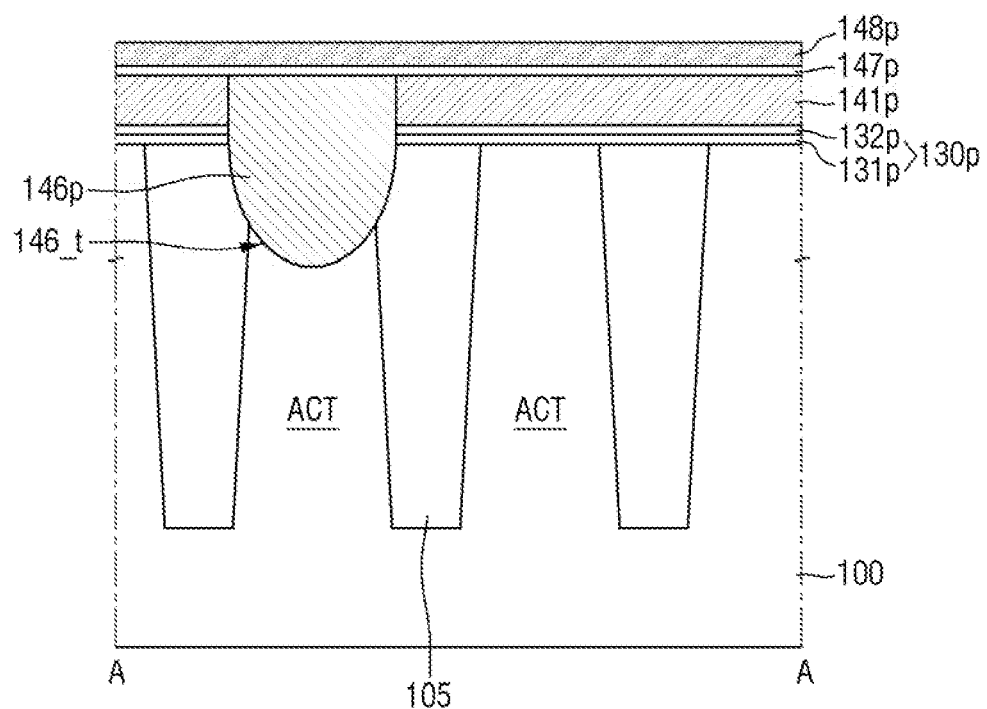

Referring to FIG. 18, a pre-cell insulation film 130p, a third pre-cell interconnection film 141p, a pre-bit line contact 146p connected to the substrate 100, a pre-metal silicide film 147p, and a pre-cell barrier film 148p may be sequentially formed on the substrate 100.

In an implementation, the pre-cell insulation film 130p may be formed on the substrate 100 and the element isolation film 105. The pre-cell insulation film 130p may include a first pre-cell insulation film 131p and a second pre-cell insulation film 132p. The third pre-cell interconnection film 141p may be formed on the pre-cell insulation film 130p.

Subsequently, a first trench 146_t exposing a portion of the active region ACT of the substrate 100 may be formed. In an implementation, the first trench 146_t may expose a center of the active region AR. Subsequently, the pre-bit line contact 146p filling the first trench 146_t may be formed.

The pre-metal silicide film 147p and the pre-cell barrier film 148p may be sequentially formed on the pre-bit line contact 146p and the third pre-cell interconnection film 141p.

Figure 19:
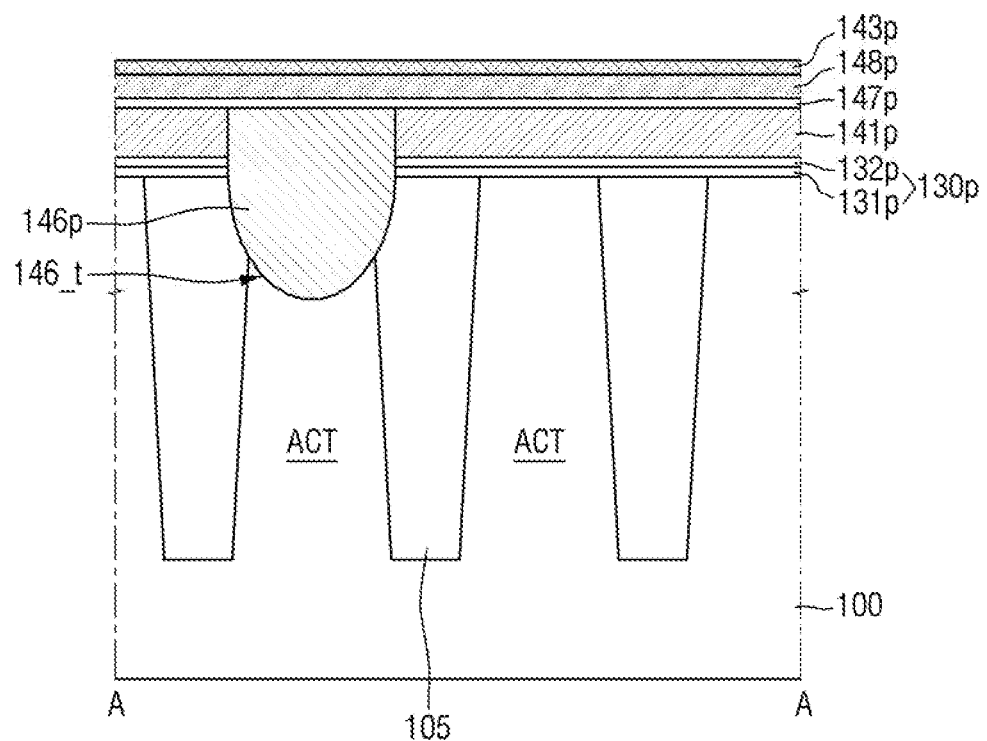

Referring to FIG. 19, a first pre-cell interconnection film 143p may be formed on the pre-cell barrier film 148p.

In an implementation, the first pre-cell interconnection film 143p may include ruthenium nitride (RuN). In this case, the first pre-cell interconnection film 143p may be formed by a physical vapor deposition (PVD) process. The first pre-cell interconnection film 143p may be formed by injecting nitrogen gas at a first temperature into a PVD process chamber in which a target including Ru is disposed. The first pre-cell interconnection film 143p including the ruthenium nitride may be formed by a transition metal of the target including ruthenium and the nitrogen gas. The first temperature may be a temperature of 200° C. or less.

Figure 20:
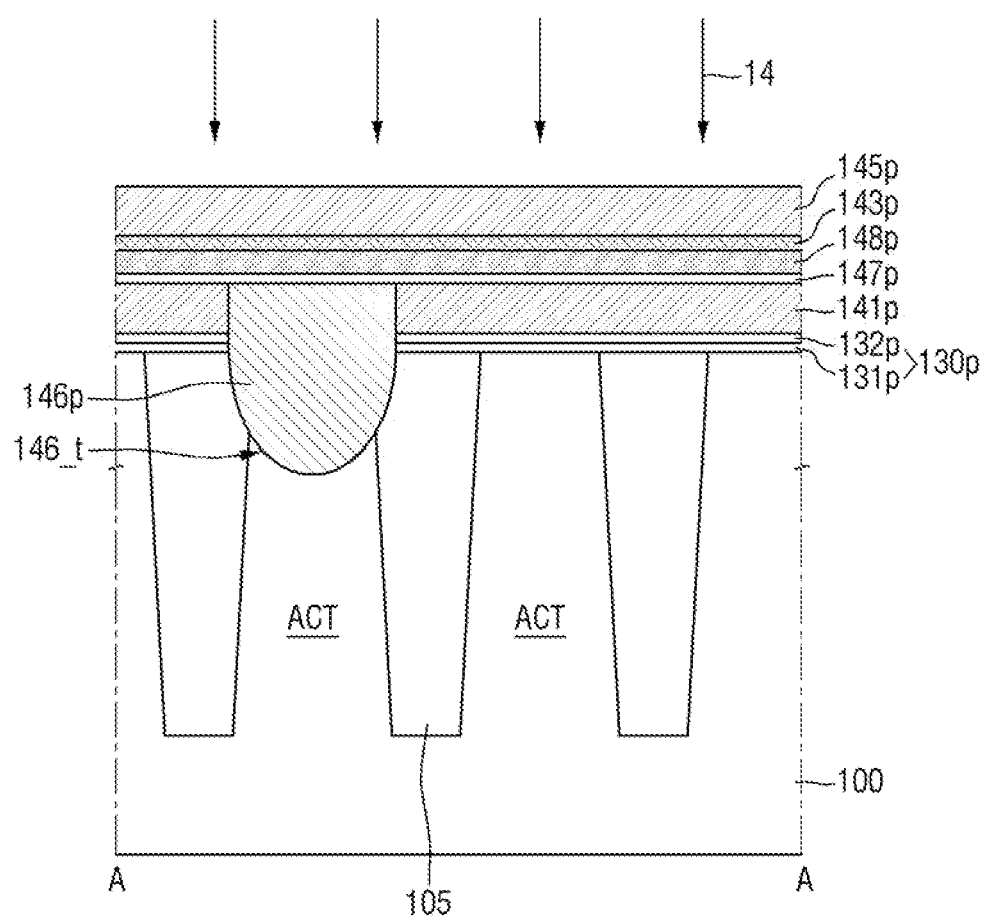

Referring to FIG. 20, a second pre-cell interconnection film 145p may be formed on the first pre-cell interconnection film 143p. Accordingly, a pre-cell interconnection structure 140p including the pre-metal silicide film 147p, the pre-cell barrier film 148p, the first pre-cell interconnection film 143p, and the second pre-cell interconnection film 145p may be formed.

In an implementation, the second pre-cell interconnection film 145p may be formed of ruthenium. In an implementation, the second pre-cell interconnection film 145p may be formed on the first pre-cell interconnection film 143p by a physical vapor deposition (PVD) process. The second pre-cell interconnection film 145p may be formed at a second temperature. The second temperature may be higher than the first temperature. The second temperature may be a temperature of 400° C. or more. The second pre-cell interconnection film 145p may be formed on the first pre-cell interconnection film 143p and may include crystal grains oriented in the [002] direction, and may not include crystal grains oriented in the [101] direction.

Subsequently, an annealing process 14 may be performed. The annealing process 14 may be performed at a third temperature. The third temperature may be a temperature higher than each of the first temperature and the second temperature. The third temperature may be a temperature of 550° C. or more.

In an implementation, when the first pre-cell interconnection film 143p is formed of ruthenium nitride, the ruthenium nitride may be separated into ruthenium and nitrogen by heat. In an implementation, the nitrogen may be absorbed into the pre-cell barrier film 148p under the first pre-cell interconnection film 143p. In an implementation, at least some of the nitrogen may remain in the first pre-cell interconnection film 143p. Accordingly, the first pre-cell interconnection film 143p may include the ruthenium. In addition, resistance of the first pre-cell interconnection film 143p may be reduced.

In addition, at least a part of the first pre-cell interconnection film 143p (which is reduced and including the ruthenium) may be oriented in a direction in which the crystal grains of the second pre-cell interconnection film 145p are oriented. In an implementation, the first pre-cell interconnection film 143p may include the crystal grains oriented in the direction in which the second pre-cell interconnection film 145p is oriented. In an implementation, the first pre-cell interconnection film 143p originally formed of an amorphous material may include the crystal grains.

Figure 21:
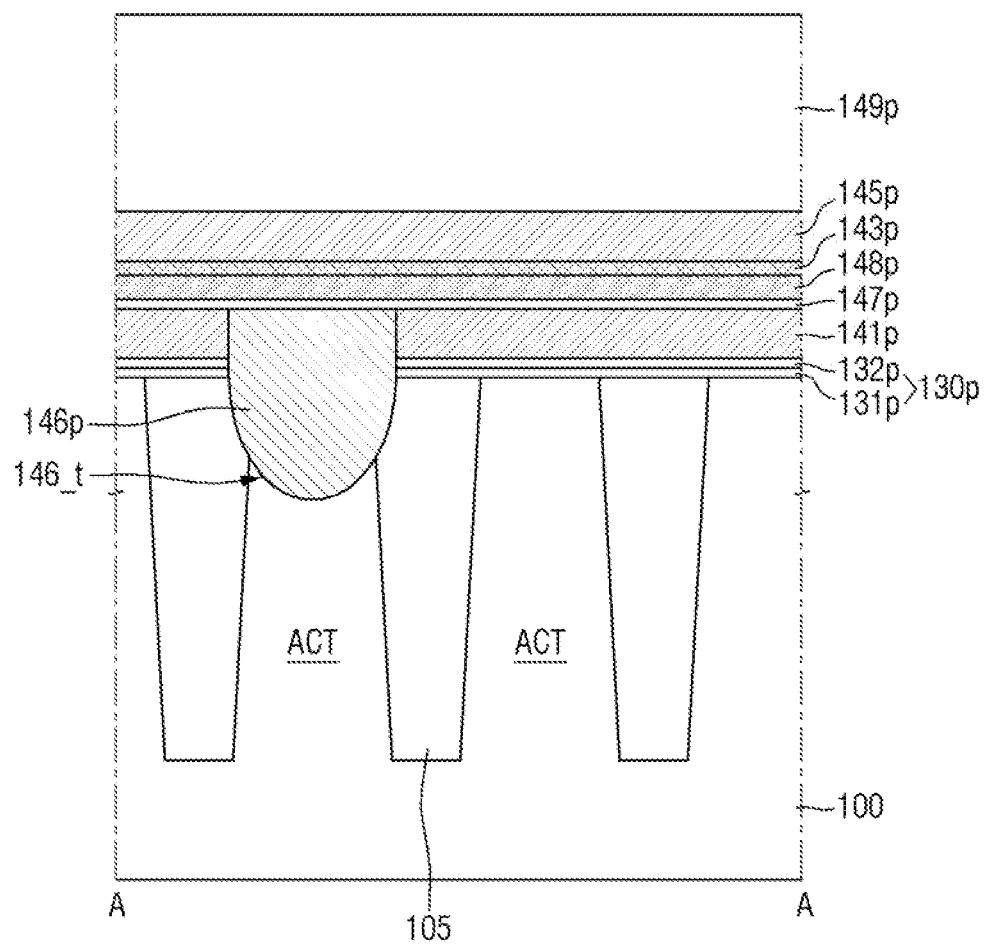

Referring to FIG. 21, a pre-cell capping film 144p may be formed on the pre-cell interconnection structure 140p.

Figure 22:
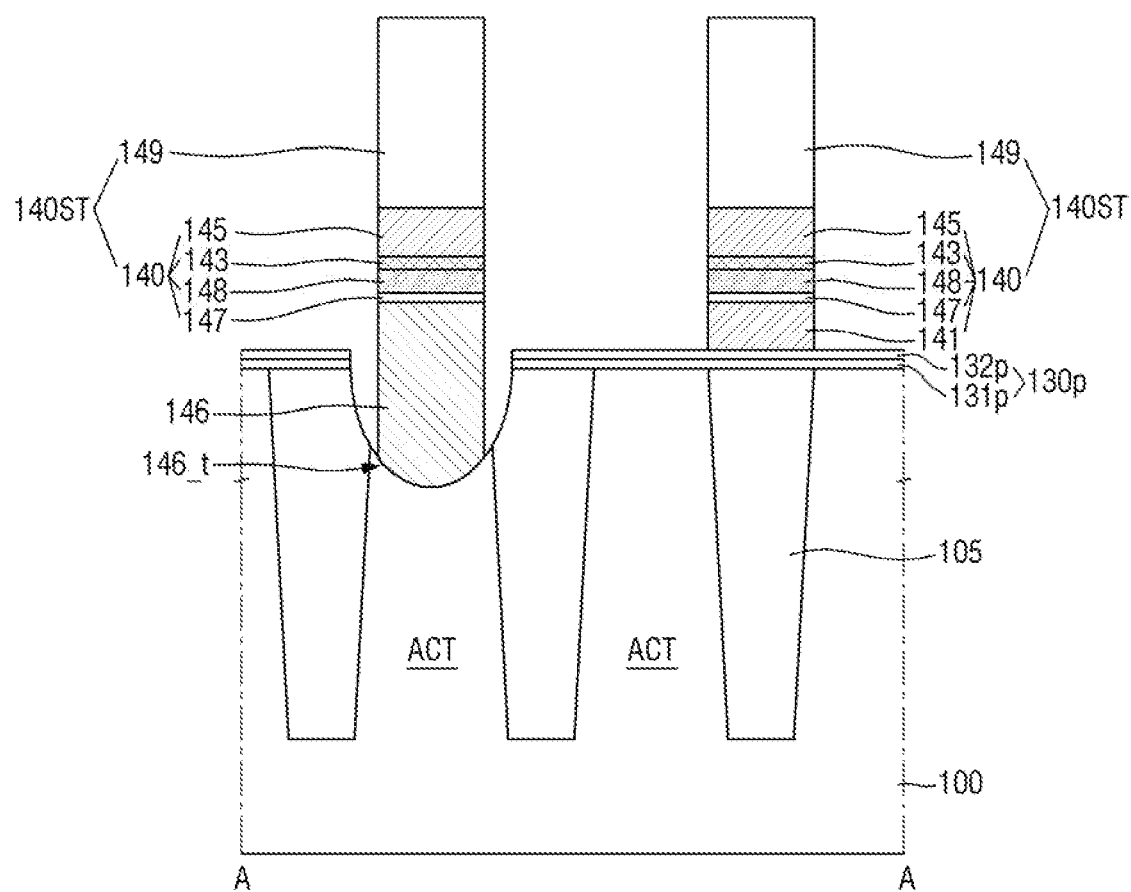

Referring to FIG. 22, the cell metal silicide film 147, the cell barrier film 148, the first cell interconnection film 143, the second cell interconnection film 145, and the cell capping film 149 extending in the second direction (D2 of FIG. 1) on the substrate 100 and the pre-cell insulation film 130*p* may be formed by etching the pre-cell interconnection structure 140*p* and the pre-cell capping film 144*p*.

In addition, the bit line contact 146 may be formed between the cell metal silicide film 147 and the substrate 100 by patterning the pre-bit line contact 146*p*.

In an implementation, the second cell interconnection film 145 may be formed of ruthenium. After the etching process, a metal oxide included in the second cell interconnection film 145 may be formed on a sidewall of the second cell interconnection film 145. The metal oxide formed on the sidewall of the second cell interconnection film 145 could deteriorate characteristics of the second cell interconnection film 145.

In order to prevent the deterioration of the characteristics of the second cell interconnection film 145, after the etching process of forming the second cell interconnection film 145, a reduction process of reducing a surface of the second cell interconnection film 145 may be performed.

The reduction process of reducing the surface of the second cell interconnection film 145 may include, e.g., a heat treatment process using a reducing gas, a high temperature plasma process using a reducing gas, or a radical process using a reducing gas. In an implementation, the reducing gas may include hydrogen ($H_2$).

In an implementation, the etching process of forming the second cell interconnection film 145 and the reduction process of reducing the surface of the second cell interconnection film 145 may be performed in-situ. In an implementation, the etching process of forming the second cell interconnection film 145 and the reduction process of reducing the surface of the second cell interconnection film 145 may be performed ex-situ.

Figure 23:
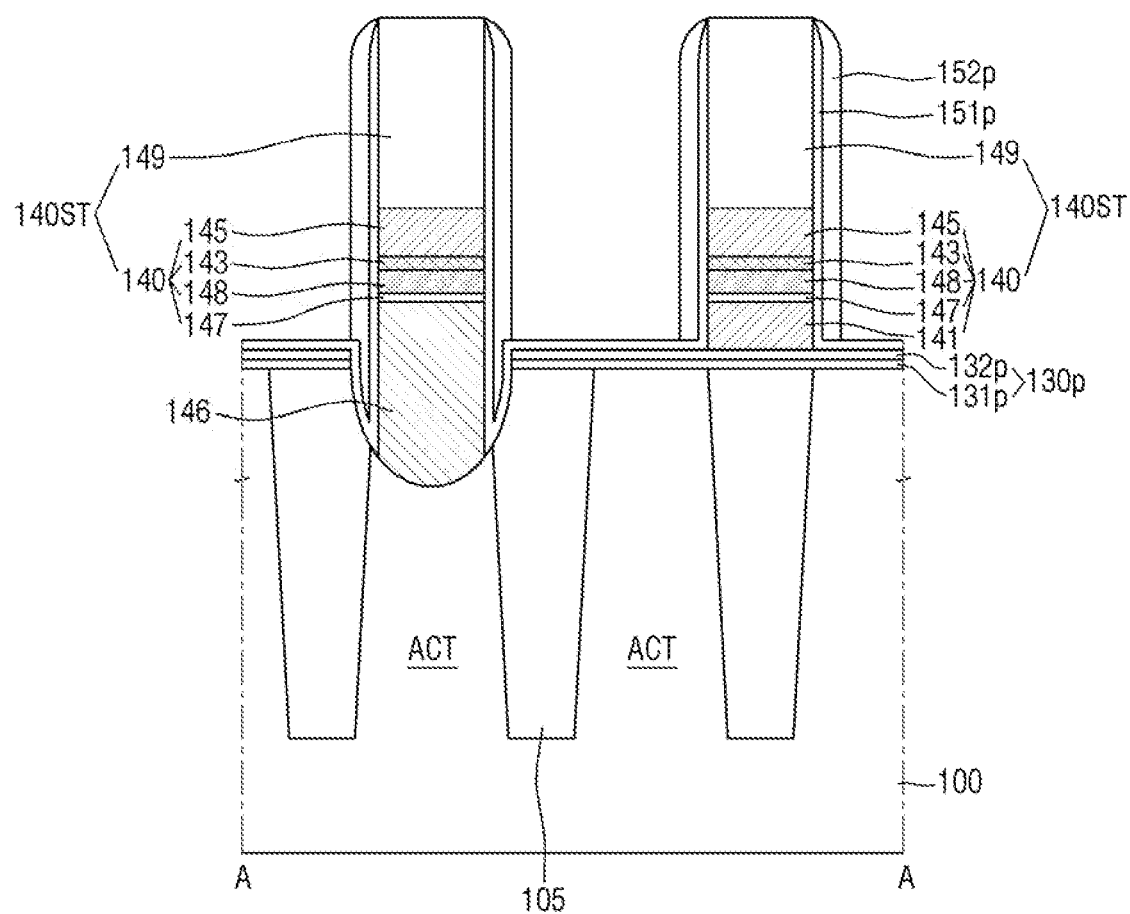

Referring to FIG. 23, the spacer structure 150 may be formed on a sidewall of a bit line structure 140_ST.

The spacer structure 150 may be formed on the substrate 100 and the element isolation film 105 in a portion of the cell interconnection structure 140 in which the bit line contact 146 is formed. The spacer structure 150 may extend in the second direction (D2 of FIG. 1) along the sidewall of the bit line structure 140_ST.

The spacer structure 150 may be formed on the cell insulation film 130 in a portion of the cell interconnection structure 140 in which the bit line contact 146 is not formed. The spacer structure 150 may extend in the second direction (D2 of FIG. 1) along the sidewall of the bit line structure 140_ST.

In an implementation, the spacer structure 150 may include a first spacer 151 and a second spacer 152. The first spacer 151 may be formed along an upper surface of the pre-cell insulation film 130*p*.

Figure 24:
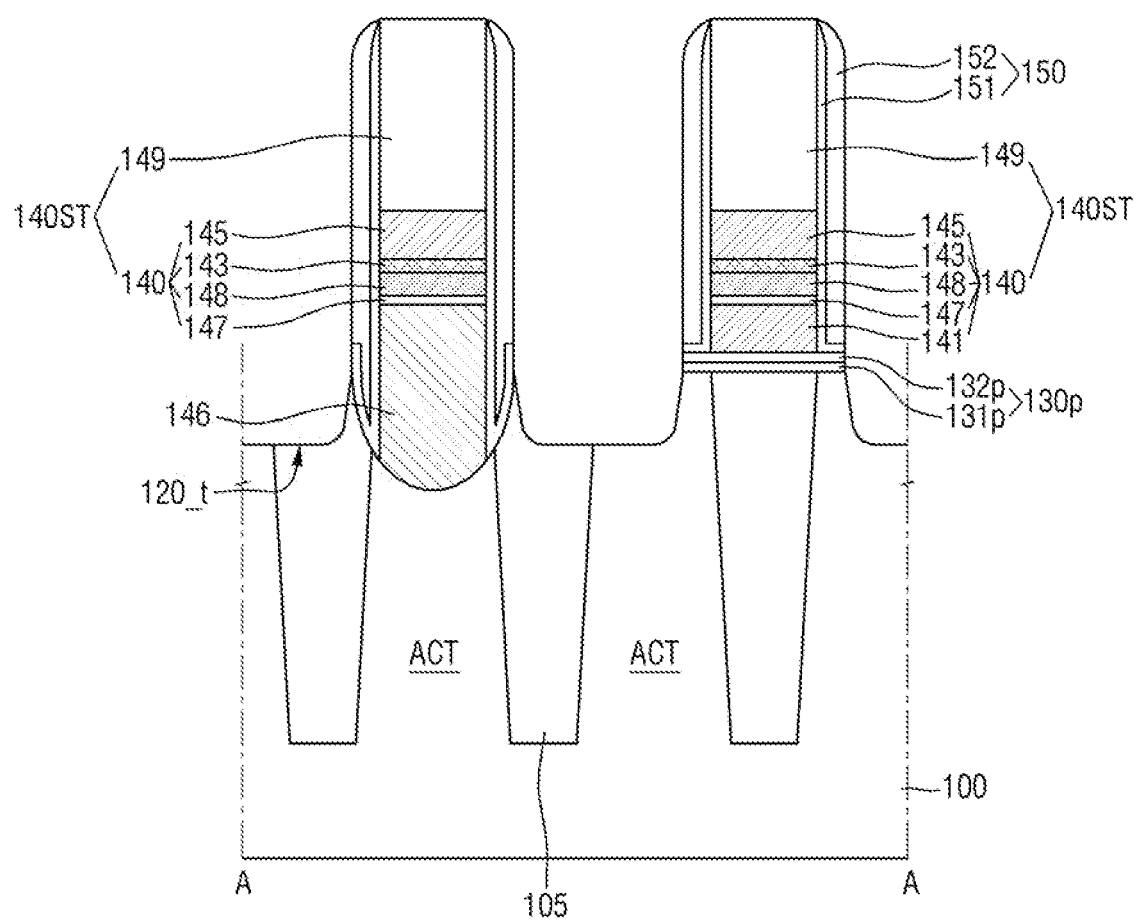

Referring to FIG. 24, a second trench 120*t* may be formed between the bit line structures 140_ST. A lower surface of the second trench 120_*t* may be formed lower than the upper surface of the substrate 100. Accordingly, the substrate 100 and the element isolation film 105 may be exposed between the bit line structures 140_ST.

In the process of forming the second trench 120_*t*, the pre-cell insulation film 130*p* and the first spacer 151 that do not overlap the bit line structure 140_ST and the second spacer 152 may be removed. Accordingly, the cell insulation film 130 may be formed.

Subsequently, referring to FIG. 7, the storage contact 120 filling the second trench 120*t* may be formed. Subsequently, the storage pad 160 and the capacitor structure 190 may be formed on the storage contact 120.

The pre-cell insulation film 130*p* that does not overlap the bit line structure 140_ST and the spacer structure 150 may be removed. The substrate 100 and the element isolation film 105 may be exposed between the bit line structures 140_ST.

One or more embodiments may provide a semiconductor device having improved electrical characteristics and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including an element isolation film and an active region defined by the element isolation film;
   a word line crossing the active region in a first direction; and
   a bit line structure on the substrate and connected to the active region, the bit line structure extending in a second direction crossing the first direction,
   wherein the bit line structure includes:
   a first cell interconnection film including an amorphous material or ruthenium,
   a second cell interconnection film on and extending along the first cell interconnection film and including ruthenium,
   a cell capping film on and extending along the second cell interconnection film, and
   a cell barrier film between the substrate and the first cell interconnection film and extending along the first cell interconnection film.

2. The semiconductor device as claimed in claim 1, wherein:
   the bit line structure further includes a third cell interconnection film between the substrate and the first cell interconnection film and extending along the first cell interconnection film, and
   the third cell interconnection film includes a doped semiconductor material.

3. The semiconductor device as claimed in claim 1, wherein the first cell interconnection film includes the amorphous material, the amorphous material including ruthenium silicide, ruthenium nitride, ruthenium oxide, magnesium oxide, titanium oxide, or graphene.

4. The semiconductor device as claimed in claim 1, wherein the cell barrier film includes a metal-containing material or graphene.

5. The semiconductor device as claimed in claim 1, further comprising a bit line contact on the active region of the substrate,
   wherein the bit line structure is on the bit line contact and electrically connected to the substrate through the bit line contact.

6. The semiconductor device as claimed in claim 5, wherein the bit line structure further includes a cell metal silicide film between the bit line contact and the cell barrier film and extending along the cell barrier film.

7. The semiconductor device as claimed in claim 1, wherein:
the first cell interconnection film includes ruthenium, and
the second cell interconnection film includes crystal grains oriented in a [002] direction and does not include crystal grains oriented in a [101] direction.

8. The semiconductor device as claimed in claim 7, wherein the first cell interconnection film includes the crystal grains oriented in the [002] direction.

9. The semiconductor device as claimed in claim 1, wherein a thickness of the second cell interconnection film is greater than a thickness of the first cell interconnection film.

10. The semiconductor device as claimed in claim 1, further comprising:
a trench in the element isolation film and the active region that are adjacent to at least one side of the bit line structure;
a storage contact filling the trench;
a landing pad on the storage contact; and
a capacitor structure on the landing pad and electrically connected to the landing pad and the storage contact.

11. A semiconductor device, comprising:
a substrate including a cell region and a peripheral region around the cell region;
a bit line structure extending in a first direction on the cell region of the substrate, the bit line structure including a first cell interconnection film, a second cell interconnection film in contact with the first cell interconnection film, and a cell capping film on the second cell interconnection film; and
a peripheral gate structure including a first peripheral interconnection film on the substrate in the peripheral region, a second peripheral interconnection film in contact with the first peripheral interconnection film, and a peripheral capping film on the second peripheral interconnection film,
wherein:
the first cell interconnection film and the first peripheral interconnection film each include an amorphous material or ruthenium,
the second cell interconnection film and the second peripheral interconnection film each include ruthenium,
the first cell interconnection film and the first peripheral interconnection film each include ruthenium or ruthenium nitride, and
the second cell interconnection film and the second peripheral interconnection film each include crystal grains oriented in a [002] direction and do not include crystal grains oriented in a [101] direction.

12. The semiconductor device as claimed in claim 11, wherein:
the bit line structure further includes a cell barrier film extending along the first cell interconnection film between the substrate in the cell region and the first cell interconnection film,
the peripheral gate structure further includes a peripheral barrier film extending along the first peripheral interconnection film between the substrate in the peripheral region and the first peripheral interconnection film, and
the cell barrier film and the peripheral barrier film each include a metal-containing material or graphene.

13. The semiconductor device as claimed in claim 12, wherein:
the bit line structure further includes a cell metal silicide film extending along the cell barrier film between the substrate in the cell region and the cell barrier film, and
the peripheral gate structure further includes a peripheral metal silicide film extending along the peripheral barrier film between the substrate in the peripheral region and the peripheral barrier film.

14. The semiconductor device as claimed in claim 11, wherein the first cell interconnection film and the first peripheral interconnection film each include the amorphous material, the amorphous material including ruthenium silicide, ruthenium nitride, ruthenium oxide, magnesium oxide, titanium oxide, or graphene.

15. The semiconductor device as claimed in claim 11, wherein the substrate in the cell region further includes:
a gate trench,
a gate electrode that fills a part of the gate trench and extends in a second direction crossing the first direction, and
a source/drain region that is adjacent to a side surface of the gate electrode.

16. A semiconductor device, comprising:
a substrate including an element isolation film and an active region defined by the element isolation film;
a bit line contact on the active region of the substrate; and
a bit line structure crossing the active region in a first direction and electrically connected to the substrate by the bit line contact,
wherein the bit line structure includes:
a first cell interconnection film on the bit line contact, the first cell interconnection film extending in the first direction and including ruthenium,
a second cell interconnection film in contact with the first cell interconnection film, the second cell interconnection film extending along the first cell interconnection film and including ruthenium,
a cell capping film on and extending along the second cell interconnection film, and
a third cell interconnection film extending along the first cell interconnection film between the substrate and the first cell interconnection film, the third cell interconnection film including a doped semiconductor material,
wherein an upper surface of the third cell interconnection film is substantially coplanar with an upper surface of the bit line contact, and
wherein the second cell interconnection film includes crystal grains oriented in a [002] direction and does not include crystal grains oriented in a [101] direction.

17. The semiconductor device as claimed in claim 16, further comprising a cell barrier film extending along the first cell interconnection film between the third cell interconnection film and the first cell interconnection film, the cell barrier film including titanium.

18. The semiconductor device as claimed in claim 16, wherein the bit line structure further includes
a cell barrier film extending along the first cell interconnection film between the third cell interconnection film and the first cell interconnection film, and
a cell metal silicide film extending along the cell barrier film between the cell barrier film and the third cell interconnection film.

* * * * *